(12) United States Patent
Shibazaki

(10) Patent No.: US 8,325,325 B2
(45) Date of Patent: Dec. 4, 2012

(54) MOVABLE BODY APPARATUS, MOVABLE BODY DRIVE METHOD, EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 514 days.

(21) Appl. No.: 12/561,480

(22) Filed: Sep. 17, 2009

(65) Prior Publication Data

US 2010/0073652 A1    Mar. 25, 2010

Related U.S. Application Data

(60) Provisional application No. 61/098,893, filed on Sep. 22, 2008, provisional application No. 61/098,902, filed on Sep. 22, 2008, provisional application No. 61/213,351, filed on Jun. 1, 2009.

(30) Foreign Application Priority Data

May 20, 2009    (JP) ................................ 2009-121821

(51) Int. Cl.
*G03B 27/58* (2006.01)
*G03B 27/32* (2006.01)
*G01B 11/00* (2006.01)

(52) U.S. Cl. ............ 355/72; 355/77; 356/399; 356/400; 356/401

(58) Field of Classification Search .................. None
See application file for complete search history.

(56) References Cited

U.S. PATENT DOCUMENTS

| | | | |
|---|---|---|---|
| 4,171,162 | A | 10/1979 | Gerard et al. |
| 4,780,617 | A | 10/1988 | Umatate et al. |
| 5,196,745 | A | 3/1993 | Trumper |
| 5,448,332 | A | 9/1995 | Sakakibara et al. |
| 5,610,715 | A | 3/1997 | Yoshii et al. |
| 5,646,413 | A | 7/1997 | Nishi |
| 6,611,316 | B2 | 8/2003 | Sewell |
| 6,778,257 | B2 | 8/2004 | Bleeker et al. |
| 6,956,222 | B2 | 10/2005 | Gilissen et al. |
| 7,023,610 | B2 | 4/2006 | Ohtsuki et al. |

(Continued)

FOREIGN PATENT DOCUMENTS

EP    1 796 144 A1    6/2007

(Continued)

OTHER PUBLICATIONS

U.S. Appl. No. 12/385,577, filed Apr. 13, 2009, in the name of Yuichi Shibazaki et al.

(Continued)

*Primary Examiner* — Toan Ton
*Assistant Examiner* — Michelle Iacoletti
(74) *Attorney, Agent, or Firm* — Oliff & Berridge, PLC

(57) ABSTRACT

A drive system drives a movable body, based on measurement results of a first measurement system which measures the position of the movable body in an XY plane by irradiating a measurement beam from an arm member on a grating placed on a surface parallel to the XY plane of the movable body. In this case, because a configuration in which the arm member irradiates a measurement beam on the grating is employed, there is no adverse effect due to the drive of the moving body, unlike the case when an encoder system is arranged on a stage surface plate. Accordingly, it becomes possible to drive the movable body with good precision.

36 Claims, 17 Drawing Sheets

U.S. PATENT DOCUMENTS

| | | |
|---|---|---|
| 7,161,659 B2 | 1/2007 | Van Den Brink et al. |
| 7,238,931 B2 | 7/2007 | Nabeshima et al. |
| 7,999,918 B2 | 8/2011 | Shibazaki |
| 2002/0041377 A1 | 4/2002 | Hagiwara et al. |
| 2003/0025890 A1 | 2/2003 | Nishinaga |
| 2004/0263846 A1 | 12/2004 | Kwan |
| 2006/0101928 A1 | 5/2006 | Binnard et al. |
| 2006/0187431 A1 | 8/2006 | Shibazaki |
| 2007/0035267 A1 | 2/2007 | Gao et al. |
| 2007/0263191 A1 | 11/2007 | Shibazaki |
| 2007/0267995 A1 | 11/2007 | Binnard et al. |
| 2007/0288121 A1 | 12/2007 | Shibazaki |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094594 A1 | 4/2008 | Shibazaki |
| 2008/0094604 A1 | 4/2008 | Shibazaki |
| 2008/0106722 A1 | 5/2008 | Shibazaki |
| 2008/0143994 A1 | 6/2008 | Shibazaki |
| 2008/0218713 A1 | 9/2008 | Shibazaki |
| 2008/0236997 A1 | 10/2008 | Ebihara |
| 2008/0278705 A1 | 11/2008 | Binnard et al. |
| 2009/0207422 A1 | 8/2009 | Loopstra et al. |
| 2009/0233234 A1 | 9/2009 | Shibazaki |

FOREIGN PATENT DOCUMENTS

| | | |
|---|---|---|
| EP | 2 068 112 A1 | 6/2009 |
| WO | WO 01/35168 AI | 5/2001 |
| WO | WO 2006/038952 A2 | 4/2006 |
| WO | WO 2007/083758 A1 | 7/2007 |
| WO | WO 2007/097379 A1 | 8/2007 |
| WO | WO 2007097380 A1 * | 8/2007 |
| WO | WO 2008/038752 A1 | 4/2008 |
| WO | WO 2008/056735 A1 | 5/2008 |
| WO | WO 2009/050675 A2 | 4/2009 |

OTHER PUBLICATIONS

International Search Report issued in Application No. PCT/JP2009/066847 on Dec. 16, 2009.

Written Opinion of the International Searching Authority issued in Application No. PCT/JP2009/066847 on Dec. 16, 2009.

International Search Report issued in International Patent Application No. PCT/JP2009/066848 on Apr. 14, 2010.

Written Opinion of the International Searching Authority issued in Patent Application No. PCT/JP2009/066848 on Apr. 30, 2010.

Mar. 2, 2012 Office Action issued in U.S. Appl. No. 12/561,533.

* cited by examiner

MOVABLE BODY APPARATUS, MOVABLE BODY DRIVE METHOD, EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/098,893 filed Sep. 22, 2008, Provisional Application No. 61/098,902 filed Sep. 22, 2008, and Provisional Application No. 61/213,351 filed Jun. 1, 2009, the disclosures of which are hereby incorporated herein by reference in its entirety.

BACKGROUND OF THE INVENTION

1. Field of the Invention

The present invention relates to movable body apparatuses, movable body drive methods, exposure apparatuses, exposure methods, and device manufacturing methods, and more particularly, to a movable body apparatus including a moving body which is movable along a predetermined plane and a movable body drive method to drive the movable body, an exposure apparatus which is equipped with the movable body apparatus and an exposure method which uses the movable body drive method, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner)) are mainly used.

In these types of exposure apparatuses, the position of a fine movement stage which moves two-dimensionally, holding a substrate (hereinafter generally referred to as a wafer) such as a wafer or a glass plate on which a pattern is transferred and formed, was measured using a laser interferometer in general. However, requirements for a fine movement stage position control with higher precision are increasing due to finer patterns that accompany higher integration of semiconductor devices recently, and as a consequence, short-term variation of measurement values due to the influence of temperature fluctuation and/or temperature gradient of the atmosphere on the beam path of the laser interferometer can no longer be ignored. To improve such an inconvenience, various inventions related to an exposure apparatus that has employed an encoder having a measurement resolution of the same level or better than a laser interferometer as the position measuring device of the fine movement stage have been proposed (refer to, e.g., PCT International Publication No. 2007/097379). However, in the liquid immersion exposure apparatus disclosed in PCT International Publication No. 2007/097379 (the corresponding U.S. Patent Application Publication. No. 2008/0088843) and the like, there still were points that should have been improved, such as a threat of the wafer stage (a grating installed on the wafer stage upper surface) being deformed when influenced by heat of vaporization and the like when the liquid evaporates.

To improve such an inconvenience, for example, in PCT International Publication No. 2008/038752 (the corresponding U.S. Patent Application Publication No. 2008/0094594), as a fifth embodiment, an exposure apparatus is disclosed which is equipped with an encoder system that has a grating arranged on the upper surface of a wafer stage configured by a light transmitting member and measures the displacement of the wafer stage related to the periodic direction of the grating by making a measurement beam from an encoder main body placed below the wafer stage enter the wafer stage and be irradiated on the grating, and by receiving a diffraction light which occurs in the grating. In this apparatus, because the grating is covered with a cover glass, the grating is immune to the heat of vaporization, which makes it possible to measure the position of the wafer stage with high precision.

However, in the exposure apparatus related to the fifth embodiment of PCT International Publication No, 2008/038752, because the encoder main body is provided at the stage surface plate supported by suspension by the projection optical system surface plate via the suspension support member, it could be affected by vibration and the like due to the drive of the stage, which could reduce the measurement accuracy of the encoder system. Further, the placement of the encoder main body adopted in the exposure apparatus related to the fifth embodiment of PCT International Publication No. 2008/038752 was difficult to adopt in the case of measuring positional information of the fine movement stage using a stage device that is a combination of a coarse movement stage that moves on a surface plate and a fine movement stage that holds a wafer and relatively moves on the coarse movement stage with respect to the coarse movement stage, or a stage device of a so-called coarse/fine movement structure, because the coarse movement stage came between the fine movement stage and the surface plate.

SUMMARY OF THE INVENTION

The present invention was made under the circumstances described above, and according to a first aspect of the present invention, there is provided a movable body apparatus, comprising: a movable body which is movable within a predetermined plane including a first axis and a second axis that are orthogonal to each other, with a measurement plane placed along a surface substantially parallel to the predetermined plane; a first measurement system which has an arm member having at least one end section facing the measurement plane and whose longitudinal direction is in a direction substantially parallel to the first axis, with at least a part of the arm member made of a solid section where light can pass through inside, the first measurement system irradiating at least one first measurement beam on the measurement plane from the arm member, receiving light from the measurement plane of the first measurement beam, and measuring a position of the movable body at least within the predetermined plane; and a drive system which drives the movable body based on an output of the first measurement system.

According to the apparatus, the movable body is driven by the drive system, based on measurement results of the first measurement system which measures the position of the movable body within the predetermined plane by irradiating the first measurement beam on the measurement plane placed along the surface substantially parallel to the predetermined plane of the movable body from the arm member. In this case, because a configuration in which the arm member irradiates at least one measurement beam on the measurement plane is employed, there is no adverse effect due to the drive of the moving body, unlike the case when an encoder system is arranged on a stage surface plate. Accordingly, it becomes possible to drive the movable body with good precision.

According to a second aspect of the present invention, there is provided an exposure apparatus that forms a pattern on an object by an irradiation of an energy beam, the apparatus comprising: the movable body apparatus of the present invention in which the object is mounted on the movable body; and a patterning device which irradiates the energy beam on the object mounted on the movable body.

According to this apparatus, because the movable body configuring the movable body apparatus can be driven with good precision, it becomes possible to transfer a pattern on the object by driving the object mounted on the movable body with good precision, and irradiating the energy beam on the object with the patterning device.

According to a third aspect of the present invention, there is provided a device manufacturing method, the method including: exposing an object using the exposure apparatus of the present invention; and developing the object which has been exposed.

According to a fourth aspect of the present invention, there is provided a movable body drive method in which a movable body is driven along a predetermined plane, the method comprising: a drive process in which the movable body is driven, by irradiating at least one first measurement beam to a measurement plane placed along a plane substantially parallel to the predetermined plane on the movable body from an arm member, which has at least one end section facing the measurement plane and whose longitudinal direction is in a first axis direction substantially parallel to the predetermined plane, with at least a part of the arm member made of a solid section where light can pass through inside, receiving a light from the measurement plane of the first measurement beam, and measuring a position of the movable body at least within the predetermined plane, based on results of the measurement.

According to this method, the movable body is driven based on measurement results of measuring the position of the movable body by irradiating the first measurement beam on the measurement plane placed along the surface substantially parallel to the predetermined plane of the movable body from the arm member. In this case, because a configuration in which the arm member irradiates at least one measurement beam on the measurement plane is employed, it becomes possible to drive the movable body with good precision.

According to a fifth aspect of the present invention, there is provided an exposure method in which a pattern is formed on an object by an irradiation of an energy beam, the method comprising: a drive process in which a movable body on which the object is mounted is driven using the movable body drive method of the present invention to perform pattern formation to the object.

According to this method, because the movable body can be driven with good precision, it becomes possible to transfer a pattern on the object by driving the object mounted on the movable body with good precision, and irradiating the energy beam on the object.

According to a sixth aspect of the present invention, there is provided a device manufacturing method, the method including: exposing an object using the exposure method of the present invention; and developing the object which has been exposed.

BRIEF DESCRIPTION OF THE DRAWINGS

In the accompanying drawings;

FIG. 12B is a view showing a rough configuration of head 78a;

FIG. 14B is a view showing a rough configuration of head 79a;

DESCRIPTION OF THE EMBODIMENTS

An embodiment of the present invention will be described below, with reference to FIGS. 1 to 11B.

Figure 1:
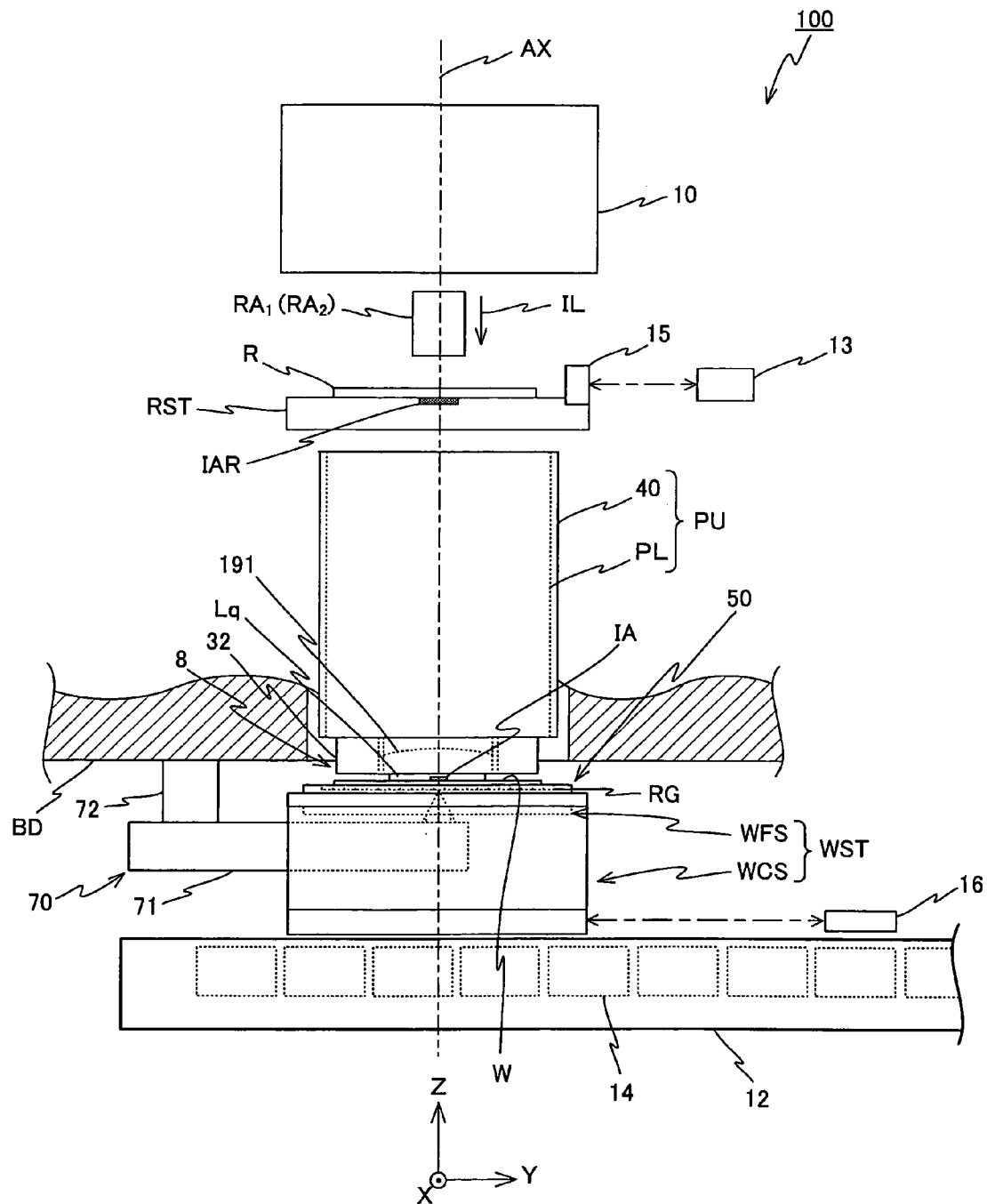
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

As shown in FIG. 1, exposure apparatus 100 is equipped with an illumination system 10, a reticle stage RST, a projection unit PU, a local liquid immersion device 8, a stage device 50 which has a fine movement stage WFS, and a control system of these sections and the like. In FIG. 1, a wafer W is mounted on fine movement stage WFS.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/025890 and the like. Illumination system 10 illuminates a slit-shaped illumination area IAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 3) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 3). Incidentally, positional information of reticle stage RST can be measured by an encoder system as is disclosed in, for example, U.S. Patent Application Publication 2007/0288121 and the like.

Projection unit PU is placed below reticle stage RST in FIG. 1. Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W whose surface is coated with a resist (sensitive agent) and is placed on a second surface (image plane surface) side of projection optical system PL. And by reticle stage RST and fine movement stage WFS being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W. Now, projection unit PU is held by a main frame BD, and in the embodiment, main frame BD is supported almost horizontally by a plurality of (e.g. three or four) support members which are each placed on an installation surface (floor surface) via a vibration isolation mechanism. Incidentally, the vibration isolation mechanism can be placed between each of the support members and mainframe BD. Further, as is disclosed in, for example, PCT International publication No. 2006/038952, projection unit PU can be supported by suspension with respect to a mainframe member (not shown) placed above projection unit PU or with respect to a reticle base.

Local liquid immersion device 8 is provided corresponding to the point that exposure apparatus 100 of the embodiment performs exposure by a liquid immersion method. Local liquid immersion device 8 includes a liquid supply device 5, a liquid recovery device 6 (both of which are not shown in FIG. 1, refer to FIG. 3), a nozzle unit 32 and the like. As shown in FIG. 1, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 3), and supplies liquid between tip lens 191 and wafer W, as well as control liquid recovery device 6 (refer to FIG. 3), and recovers liquid from between tip lens 191 and wafer W. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as the liquid above, pure water that transmits the ArF excimer laser beam (light with a wavelength of 193 nm) is to be used. Incidentally, refractive index n of the water with respect to the ArF excimer laser beam is around 1.44, and in the pure water, the wavelength of illumination light IL is 193 nm×1/n, shorted to around 134 nm.

As shown in FIG. 1, stage device 50 is equipped with a base board 12 which is almost horizontally supported by vibration isolation mechanisms (omitted in drawings) on the floor surface, a wafer stage WST which moves on base board 12 holding wafer W, various measurement systems (16, 70 (refer to FIG. 3) and the like) and the like.

Base board 12 is made of a member having a tabular form, and the degree of flatness of the upper surface is extremely high and serves as a guide surface when wafer stage WST moves.

Figure 2A:
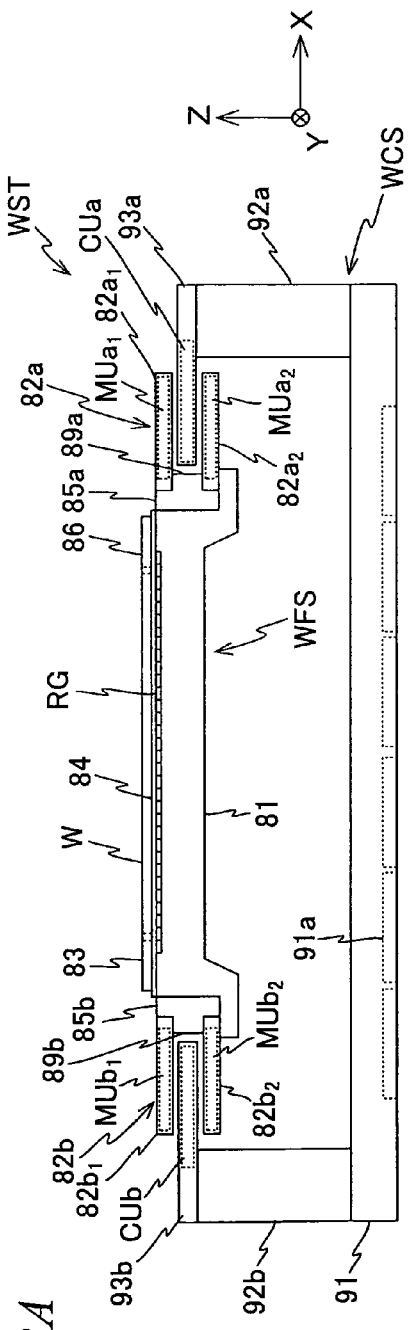
FIG. 2A shows a side view of a stage unit which the exposure apparatus in FIG. 1 is equipped with when viewed from a −Y direction.

As shown in FIGS. 1, 2A and the like, wafer stage WST has a wafer coarse movement stage (hereinafter, shortly referred to as a coarse movement stage) WCS, which is supported by levitation above base board 12 by a plurality of non-contact bearings (e.g., air bearings (omitted in drawings)) provided on its bottom surface and is driven in an XY two-dimensional direction by a coarse movement stage drive system 51 (refer to FIG. 3), and a wafer fine movement stage (hereinafter, shortly referred to as a fine movement stage) WFS, which is supported in a non-contact manner by coarse movement stage WCS and is relatively movable with respect to coarse movement stage WCS. Fine movement stage WFS is driven by a fine movement stage drive system 52 (refer to FIG. 3) with respect to coarse movement stage WCS in directions of six degrees of freedom (X, Y, Z, θx, θy, θz).

Positional information (also including rotation information in the θz direction) in the XY plane of wafer stage WST is measured by a wafer stage position measurement system 16. Further, positional information of fine movement stage WFS in directions of six degrees of freedom (X, Y, Z, θx, θy, θz) is measured by a fine movement stage position measurement system 70 (refer to FIG. 3). Measurement results of wafer stage position measurement system 16 and fine movement stage position measurement system 70 are supplied to main controller 20 (refer to FIG. 3) for position control of coarse movement stage WCS and fine movement stage WFS.

Configuration and the like of each part configuring stage device 50 including the various measurements system described above will be explained in detail, later on.

In exposure apparatus 100, a wafer alignment system ALG (not shown in FIG. 1, refer to FIG. 3) is placed at a position a predetermined distance away on the +Y side from the center of projection unit PU. As wafer alignment system ALG, for example, an FIA (Field Image Alignment) system by an image processing method is used. Wafer alignment system ALG is used by main controller 20 on wafer alignment (e.g., Enhanced Global Alignment (EGA)) when detecting a second fiducial mark that will be described later formed on a measurement plate on fine movement stage WFS, or when detecting an alignment mark on wafer W. Imaging signals of wafer alignment system ALG is supplied to main controller 20 via a signal processing system (not shown). Main controller 20 computes X, Y coordinates of an object mark in a coordinate system at the time of alignment, based on detection results (imaging results) of alignment system ALG and positional information of fine movement stage WFS (wafer W) at the time of detection.

Besides this, in exposure apparatus 100 of the embodiment, a multiple point focal point position detection system (hereinafter shortly referred to as a multipoint AF system) AF (not shown in FIG. 1, refer to FIG. 3) having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 3) via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of wafer alignment detection system ALG, the so-called focus leveling control of wafer W can be performed at the time of exposure, using the surface position information and measurement values of a laser interferometer system 75 (refer to FIG. 3) configuring a part of fine movement stage position measurement system 70 which will be described later on. Incidentally, measurement values of an encoder system 73 which will be described later configuring fine movement stage position measurement system 70 can also be used, rather than laser interferometer system 75 in focus leveling control.

Further, above reticle stage RST, as is disclosed in detail in, for example, U.S. Pat. No. 5,646,413, a pair of reticle alignment systems $RA_1$ and $RA_2$ (reticle alignment system $RA_2$ is hidden behind reticle alignment system $RA_1$ in the depth of the page surface in FIG. 1.) using an image processing method is placed that has an imaging device such as a CCD and the like and uses a light (in the embodiment, illumination light IL) of the exposure wavelength as an illumination light for alignment. The pair of reticle alignment systems $RA_1$ and $RA_2$ is used to detect a positional relation between a detection center of a projection area of a pattern of reticle R by projection optical system PL and a reference position on the measurement plate, or in other words, the positional relation with a center of a pair of first fiducial marks, in a state where the measurement plate to be described later on fine movement stage WFS is positioned directly below projection optical system PL, by main controller 20 detecting a projection image of a pair of reticle alignment marks (omitted in drawings) formed on reticle R and a corresponding pair of first fiducial marks on the measurement plate via projection optical system PL. Detection signals of reticle alignment detection systems $RA_1$ and $RA_2$ are supplied to main controller 20 (refer to FIG. 3) via a signal processing system (not shown). Incidentally, reticle alignment systems $RA_1$ and $RA_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Figure 3:
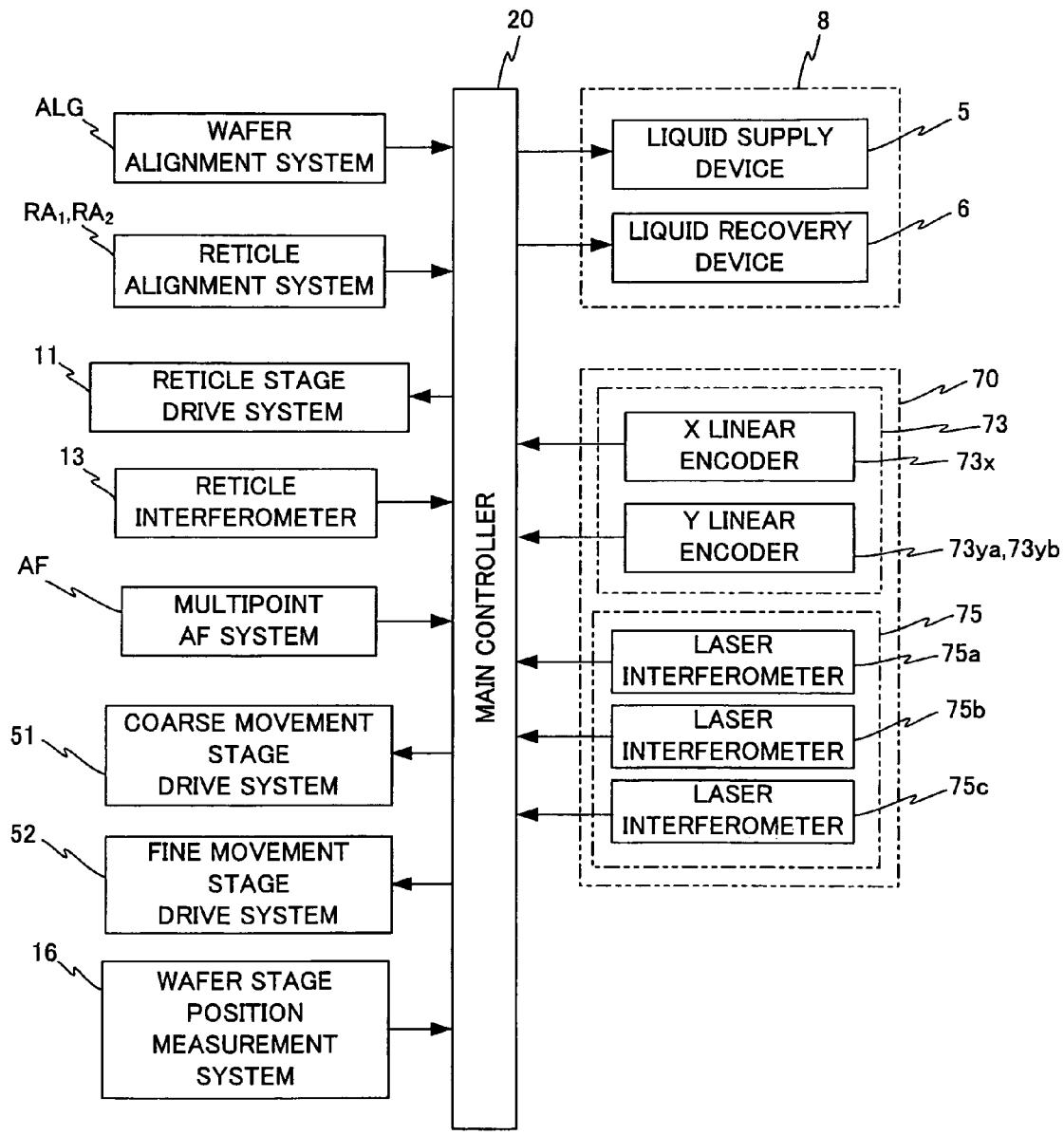
FIG. 3 is a block diagram showing a configuration of a control system of the exposure apparatus in FIG. 1.

FIG. 3 shows the main configuration of the control system of exposure apparatus 100. The control system is mainly configured of main controller 20. Main controller 20 includes a workstation (or a microcomputer) and the like, and has overall control over each part of exposure apparatus 100, such as liquid immersion device 8, coarse movement stage drive system 51, and fine movement stage drive system 52 previously described.

Now, a configuration and the like of stage device 50 will be described in detail. Inside base 12, a coil unit is housed, including a plurality of coils 14 placed in the shape of a matrix with the XY two-dimensional direction serving as a row direction and a column direction, as shown in FIG. 1.

In correspondence with the coil unit, on the bottom surface (the bottom surface of a coarse movement slider section 91 to be described later) of coarse movement stage WCS, a magnet unit is provided consisting of a plurality of permanent magnets 91a placed in the shape of a matrix with the XY two-dimensional direction serving as a row direction and a column direction, as shown in FIG. 2A. The magnet unit configures a coarse movement stage drive system 51 (refer to FIG. 3) consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 3). Coarse movement stage WCS is supported by levitation above base board 12, for example, via a predetermined clearance of around several μm above of base board 12, by the air bearings previously described fixed in the periphery of the bottom surface of coarse movement slider section 91 in which the magnet unit was provided, and is driven in the X-axis direction, the Y-axis direction, and the θz direction, via coarse movement stage drive system 51. Incidentally, as coarse movement stage drive system 51, the drive method is not limited to the planar motor using the Lorentz electromagnetic force drive method, and for example, a planar motor by a variable reluctance drive system can also be used. Besides this, coarse movement stage drive system 51 can be configured by a planar motor of a magnetic levitation type. In this case, the air bearings will not have to be arranged on the bottom surface of coarse movement slider section 91.

Figure 2B:
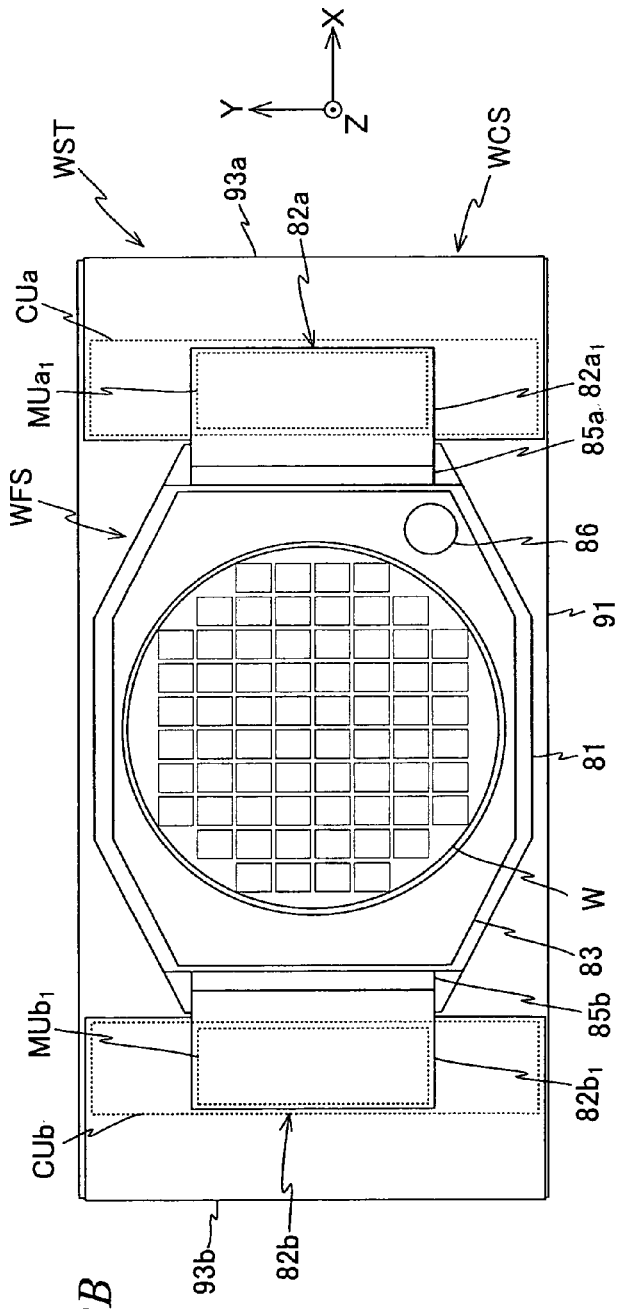
FIG. 2B is the stage device shown in a planar view.

As shown in FIGS. 2A and 2B, coarse movement stage WCS is equipped with a rectangular plate shaped coarse movement slides section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction in a state parallel to the YZ surface, with the Y-axis direction serving as the longitudinal direction, and a pair of stator sections 93a and 93b that are each fixed on the upper surface of side wall sections 92a and 92b. As a whole, coarse movement stage WCS has a box like shape having a low height whose upper surface in a center in the X-axis direction and surfaces on both sides in the Y-axis direction are open. More specifically, in coarse movement stage WCS, a space is formed inside penetrating the stage in the Y-axis direction. The pair of stator sections 93a and 93b is each made of a member with a tabular outer shape, and in the inside, coil units CUa and CUb are housed consisting of a plurality of coils to drive fine movement stage WFS. The magnitude and direction of current supplied to each of the coils configuring coil units CUa and CUb are controlled by main controller 20 (refer to FIG. 3). The configuration of coil units CUa and CUb will be described further, later in the description.

As shown in FIGS. 2A and 213, the pair of stator sections 93a and 93b each has a rectangle tabular shape whose longitudinal direction is in the Y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, main body section 81 can be structured all by the transparent material or only the section which the measurement beam, of the encoder system passes through can be structured by the transparent material, and only the section which this measurement beam passes through can be formed solid.

In the center of the upper surface of main body section 81 (to be more precise, a cover glass which will be described later on) of fine movement stage WFS, a wafer holder (not shown) is arranged which holds wafer W by vacuum suction or the like. In the embodiment, for example, a wafer holder of a-so-called pin chuck method on which a plurality of support sections (pin members) supporting wafer W are formed within a loop shaped projecting section (rim section) is used, and grating RG previously described is provided on the other surface (rear surface) of the wafer holder whose one surface (surface) is a wafer mounting surface. Incidentally, the wafer holder can be formed integrally with fine movement stage WFS, or can be fixed to main body section 81, for example, via an electrostatic chuck mechanism, a clamping mechanism, or by adhesion and the like.

Furthermore, on the upper surface of main body section 81 on the outer side of the wafer holder (mounting area of wafer W), as shown in FIGS. 2A and 2B, a plate (a liquid repellent plate) 83 is attached that has a circular opening one size larger than wafer W (the wafer holder) formed in the center, and also has an octagonal outer shape (contour) corresponding to main body section 81. A liquid repellent treatment against liquid Lq is applied to the surface of plate 83 (a liquid repellent surface is formed). Plate 83 is set fixed to the upper surface of main body section 81 so that its entire surface (or a part of its surface) becomes substantially flush with the surface of wafer W. Further, in plate 83, a circular notch is formed in the vicinity of the +X end and the −Y side end as shown in FIG. 2B, and inside the notch, a measurement plate 86 is embedded in a state where its surface is substantially flush with the surface of plate 83, or more specifically, the surface of wafer W. On the surface of measurement plate 86, at least a pair of first fiducial marks detected by each of the pair of reticle alignment detection systems $RA_1$ and $RA_2$ and a second fiducial mark detected by wafer alignment system ALG are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86) surrounding the wafer holder.

As shown in FIG. 2A, in the area one size larger than wafer W on the upper surface of main body section 81, a two-dimensional grating (hereinafter merely referred to as a grating) RG is placed horizontally (parallel to the wafer W surface). Grating RG is fixed to (or formed on) the upper surface of main body section 81 which is made of a transparent material, Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where a two-dimensional grating is fixed or formed, as an example, is in a circular shape which is one size larger than wafer W.

Grating RG is covered and protected with a protective member, such as, for example, a cover glass 84. In the embodiment, on the upper surface of cover glass 84, the electrostatic chuck mechanism previously described to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal, ceramics, or can be made by a thin film and the like. Further, although a plate shaped protective member is desirable because a sufficient thickness is required to protect grating RG, a thin film protective member can also be used depending on the material.

Incidentally, of the forming area of grating RG, it is desirable, for example, to provide a reflection member (e.g. a thin film and the like) which covers the forming area on one surface of cover glass 84 corresponding to an area spreading in the periphery of the wafer holder, so that the measurement beam of the encoder system irradiated on grating RG does not pass through cover glass 84, or more specifically, so that the intensity of the measurement beam does not change greatly in the inside and the outside of the area on the rear surface of the wafer holder.

Besides this, the other surface of the transparent plate which has grating RG fixed or formed on one surface can be placed in contact or in proximity to the rear surface of the wafer holder and a protective member (cover glass 84) can also be provided on the one surface side of the transparent plate, or, the one surface of the transparent plate which has grating RG fixed or formed can be placed in contact or in proximity to the rear surface of the wafer holder, without having the protective member (cover glass 84) arranged. Especially in the former case, grating RG can be fixed to or formed on an opaque member such as ceramics instead of the transparent plate, or grating RG can be is fixed to or formed on the rear side of the wafer holder. Or, a conventional fine movement stage can simply hold the wafer holder and grating RG. Further, the wafer holder can be made of a solid glass member, and grating RG can be placed on the upper surface (wafer mounting surface) of the glass member.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is a plate whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 2A and 2B, mover section 82a includes two plate-like members $82a_1$ and $82a_2$ having a rectangular shape in a planar view whose size (length) in the Y-axis direction and size (width) in the X-axis direction are both shorter than stator section 93a (around half the size). These two plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side in the longitudinal direction of main body section 81. In this case, the −X side end of plate-like member $82a_2$ is clamped by spacer 85a and, the extending section on the +X side of main body section 81. Between the two plate-like members $82a_1$ and $82a_2$, an end on the −X side of stator section 93a of coarse movement stage WCS is inserted in a non-contact manner. Inside plate-like members $82a_1$ and $82a_2$, magnet units $MUa_1$ and $MUa_2$ which will be described later are provided.

Mover section 82b includes two plate-like members $82b_1$ and $82b_2$ maintained at a predetermined distance from a spacer 85b in the Z-axis direction (vertically), and is configured in a similar manner with mover section 82a, although being symmetrical. Between the two plate-like members $82b_1$ and $82b_2$, an end on the +X side of stator section 93b of coarse movement stage WCS is inserted in a non-contact manner. Inside plate-like members $82b_1$ and $82b_1$, magnet units $MUb_1$ and $MUb_2$ are provided, which are configured similar to magnet units $MUa_1$ and $MUa_2$.

Now, as is previously described, because the surface on both sides in the Y-axis direction of coarse movement stage WCS is open, when attaching fine movement stage WFS to coarse movement stage WCS, the position of fine movement stage WFS in the Z-axis direction should be positioned so that stator section 93a, 93b are located between plate-like members $82a_1$ and $82a_2$, and $82b_1$ and $82b_2$, respectively, and then fine movement stage WFS can be moved (slid) in the Y-axis direction.

Next, a configuration of fine movement stage drive system 52 to drive fine movement stage WFS with respect to coarse movement stage WCS will be described. Fine movement stage drive system 52 includes the pair of magnet units $MUa_1$ and $MUa_2$ that mover section 82a previously described has, coil unit CUa that stator section 93a has, the pair of magnet units $MUb_1$ and $MUb_2$ that mover section 82b has, and coil unit CUb that stator section 93b has.

This will be explained further in detail. As it can be seen from FIGS. 4, 5A, and 5B, at the end on the −X side inside stator section 93a, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding 55a and a lower part winding 55b in a rectangular shape in a planar view that are disposed such that they overlap in the vertical direction (the Z-axis direction). Further, between the two lines of coil rows described above inside stator section 93a, an X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are placed equally spaced in the X-axis direction. Coil unit CUa is configured including the two lines of coil rows and X coil 56.

Incidentally, in the description below, while one of the stator sections 93a of the pair of stator sections 93a and 93b and mover section 82a supported by this stator section 93a will be described based on FIGS. 4 to 6, the other (the −X side) stator section 93b and mover section 82b will be structured similar to these sections and will function in a similar manner. Accordingly, coil unit CUb, magnet units $MUb_1$ and $MUb_2$ are structured similar to coil unit CUa, and magnet units $MUa_1$ and $MUa_2$.

Figure 4:
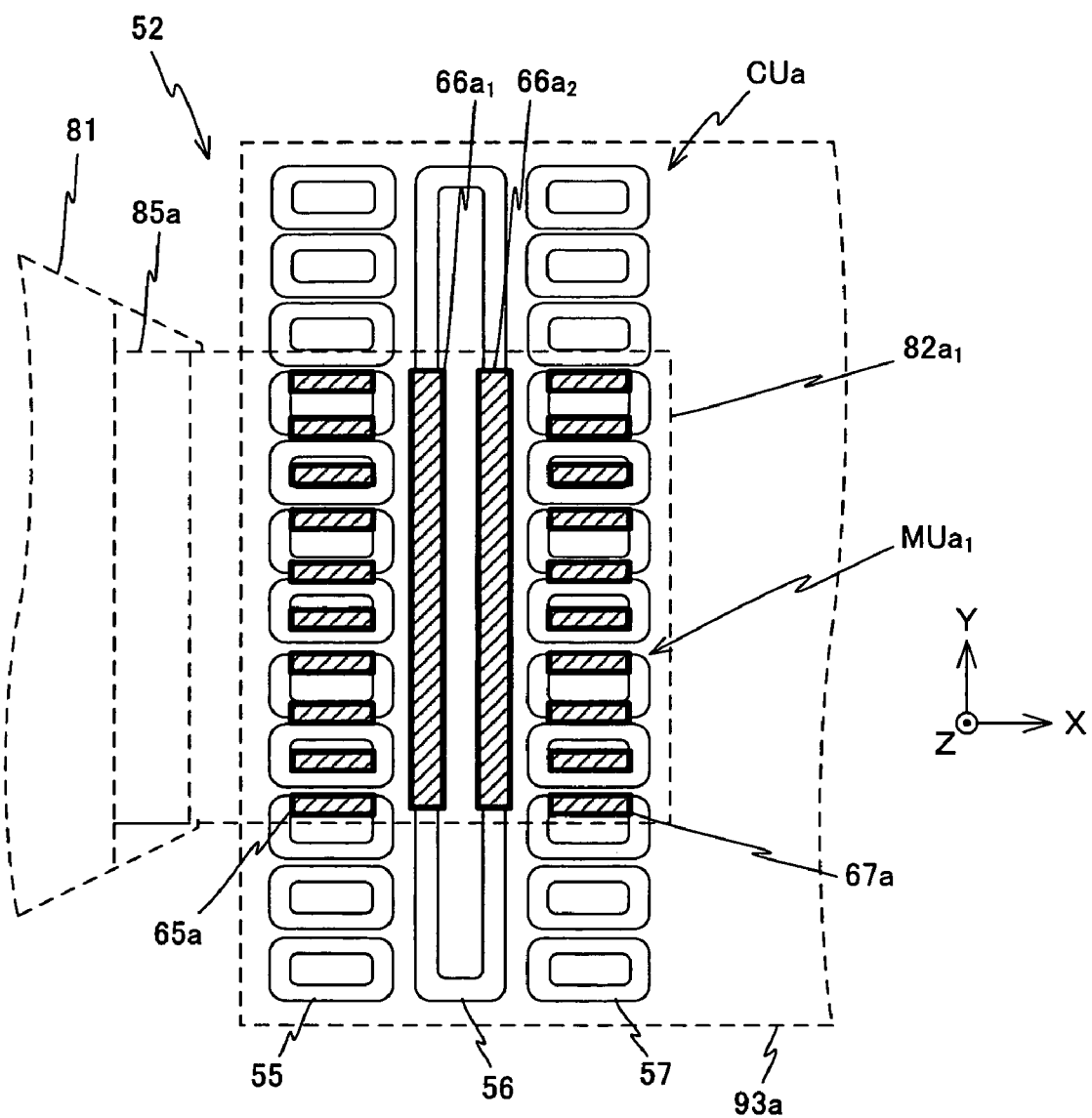
FIG. 4 is a planar view showing a placement of a magnet unit and a coil unit that structure a fine movement stage drive system.
Figure 5A:
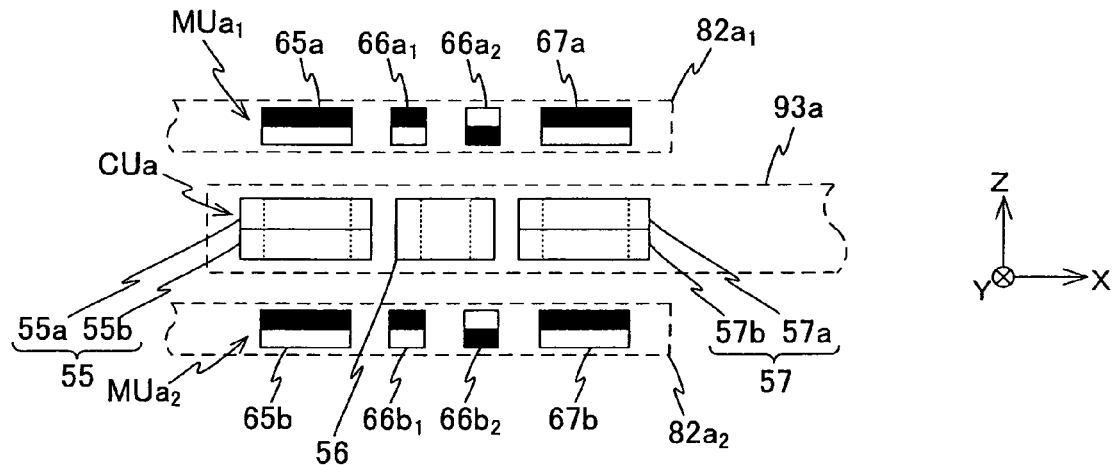
FIG. 5A is a side view showing a placement of a magnet unit and a coil unit that structure a fine movement stage drive system when viewed from the −Y direction.
Figure 5B:
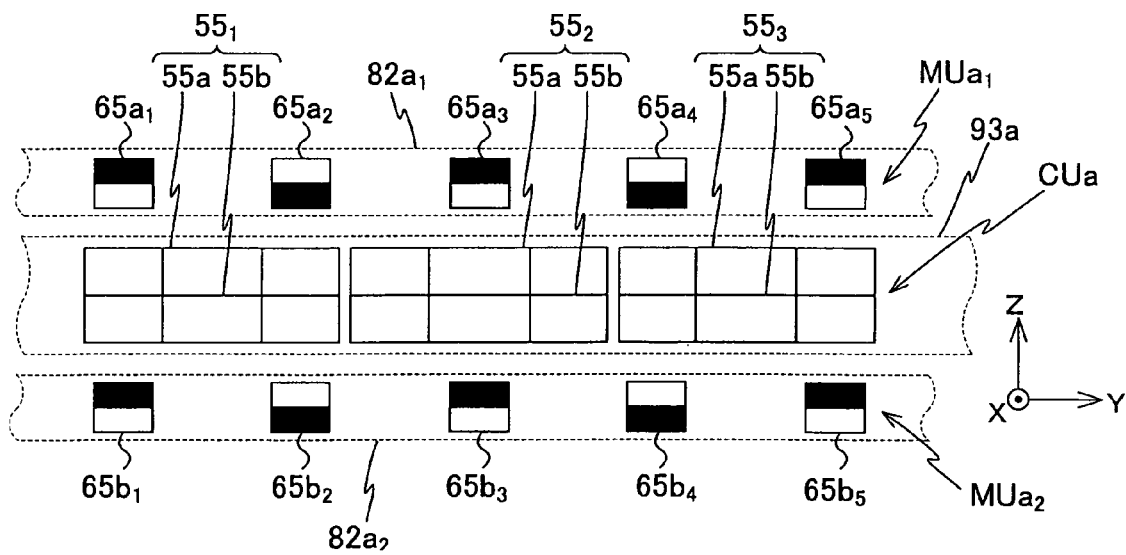
FIG. 5B is a side view showing a placement of a magnet unit and a coil unit that structure a fine movement stage drive system when viewed from the +X direction.

Inside plate-like member $82a_1$ on the +Z side configuring a part of movable section 82a of fine movement stage WFS, as it can be seen when referring to FIGS. 4, 5A, and 5B, two lines of magnet rows are placed a predetermined distance apart in the X-axis direction, which are a plurality of (in this case, ten) permanent magnets 65a and 67a that have a rectangular shape in a planar view and whose longitudinal direction is in the X-axis direction. The two lines of magnet rows are placed facing coils 55 and 57, respectively.

As shown in FIG. 5B, the plurality of permanent magnets 65a are configured such that permanent magnets whose upper surface sides (+Z sides) are N poles and the lower surface sides (−Z sides) are S poles and permanent magnets whose upper surface sides (+Z sides) are S poles and the lower surface sides (−Z sides) are N poles are arranged alternately in the Y-axis direction. The magnet row consisting of the plurality of permanent magnets 67a is structured similar to the magnet row consisting of the plurality of permanent magnets 65a.

Further, between the two lines of magnet rows described above inside plate-like member $82a_1$, a pair (two) of permanent magnets $66a_1$ and $66a_2$ whose longitudinal direction is in the Y-axis direction is placed set apart in the X axis direction, facing coil 56. As shown in FIG. 5A, permanent magnet $66a_1$ is configured such that its upper surface side (+Z side) is an N pole and its lower surface side (−Z side) is an S pole, whereas with permanent magnet $66a_2$, its upper surface side (+Z side) is an S pole and its lower surface side (−Z side) is an N pole.

Magnet unit $MUa_1$ is configured by the plurality of permanent magnets 65a and 67a, and $66a_1$ and $66a_2$ described above.

As shown in FIG. 5A, also inside plate-like member $82a_2$ on the −Z side, permanent magnets 65b, $66b_1$, $66b_2$, and 67b are placed in a placement similar to plate-like member $82a_1$ on the +Z side described above. Magnet unit $MUa_2$ is configured by these permanent magnets 65b, $66b_1$, $66b_2$, and 67b. Incidentally, in FIG. 4, permanent magnets 65b, $66b_1$, $66b_2$, and 67b inside plate-like members $82a_2$ on the −Z side are in the depth of the page surface, with magnets 65a, $66a_1$, $66a_2$, and 67a placed on top.

Now, with fine movement stage drive system 52, as shown in FIG. 5B, positional relation (each distance) in the Y-axis direction between the plurality of permanent magnets 65 and the plurality of YZ coils 55 is set so that in the plurality of permanent magnets (in FIG. 5 B, permanent magnets $65a_1$ to $65a_5$ which are sequentially arranged along the Y-axis direction) placed adjacently in the Y-axis direction, when two adjacent permanent magnets $65a_1$ and $65a_2$ each face the winding section of YZ coil $55_1$, then permanent magnet $65a_3$ adjacent to these permanent magnets does not face the winding section of YZ coil $55_2$ adjacent to YZ coil $55_1$ described above (so that permanent magnet $65a_3$ faces the hollow center in the center of the coil, or faces a core, such as an iron core, to which the coil is wound). Incidentally, as shown in FIG. 5B, permanent magnets $65a_4$ and $65a_5$ each face the winding section of YZ coil $55_3$, which is adjacent to YZ coil $55_2$. The distance between permanent magnets 65b, 67a, and 67b in the Y-axis direction is also similar (refer to FIG. 5B).

Figure 6A:
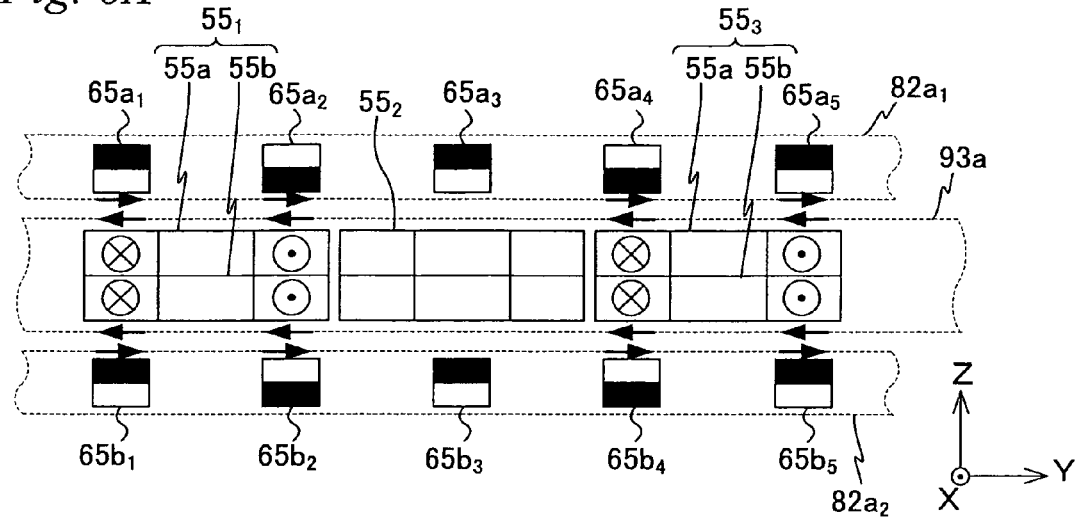
FIG. 6A is a view used to explain a drive principle when a fine movement stage is driven in the Y-axis direction.

Accordingly, in fine movement stage drive system 52, as an example, when a clockwise electric current when viewed from the +Z direction is supplied to the upper part winding and the lower part winding of coils $55_1$ and $55_3$, respectively, as shown in FIG. 6A, in a state shown in FIG. 5B, a force (Lorentz force) in the −Y direction acts on coils $55_1$ and $55_3$, and as a reaction force, a force in the +Y direction acts on permanent magnets 65a and 65b. By these action of forces, fine movement stage WFS moves in the +Y direction with respect to coarse movement stage WCS. When a counterclockwise electric current when viewed from the +Z direction is supplied to each of the coils $55_1$ and $55_3$ conversely to the case described above, fine movement stage WFS moves in the −Y-direction with respect to coarse movement stage WCS.

By supplying an electric current to coil 57, electromagnetic interaction is performed between permanent magnet 67 (67a, 67b) and fine movement stage WFS can be driven in the Y-axis direction. Main controller 20 controls the position of fine movement stage WFS in the Y-axis direction by controlling the current supplied to each coil.

Figure 6B:
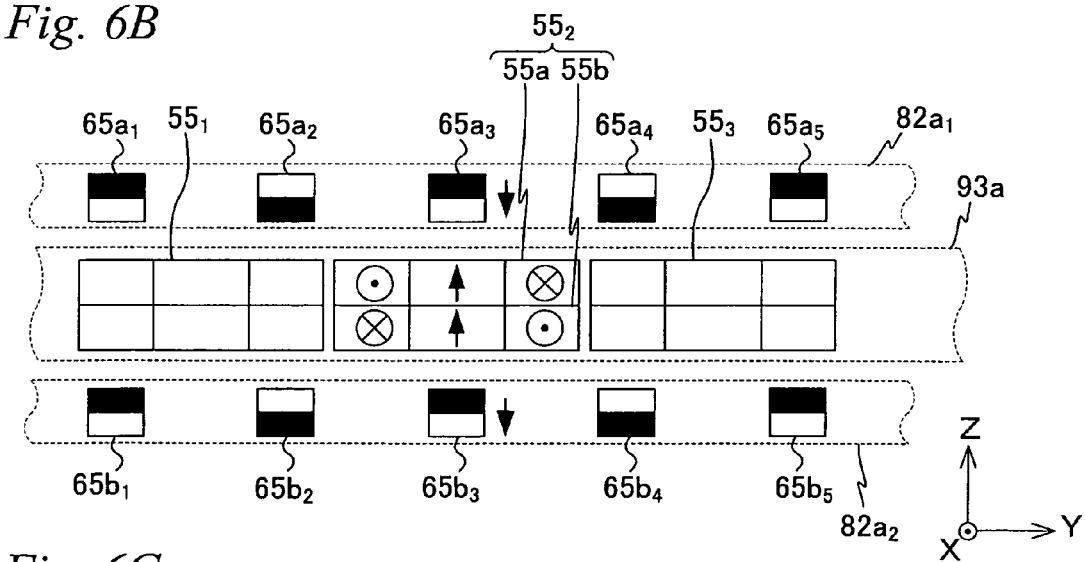
FIG. 6B is a view used to explain a drive principle when a fine movement stage is driven in the Z-axis direction.

Further, in fine movement stage drive system 52, as an example, when a counterclockwise electric current when viewed from the +Z direction is supplied to the upper part winding of coil $55_2$ and a clockwise electric current when viewed from the +Z direction is supplied to the lower part winding as shown in FIG. 6B, in a state shown in FIG. 5B, an attraction force is generated between coil $55_2$ and permanent magnet $65a_3$ whereas a repulsive force (repulsion) is generated between coil $55_2$ and permanent magnet $65b_3$, respectively, and by these attraction force and repulsive force, fine movement stage WFS is moved upward (+Z direction) with respect to coarse movement stage WSC, or more particularly, moved in a direction of levitation. Main controller 20 controls the position of fine movement stage WFS in the Z direction which is in a levitated state by controlling the current supplied to each coil.

Figure 6C:
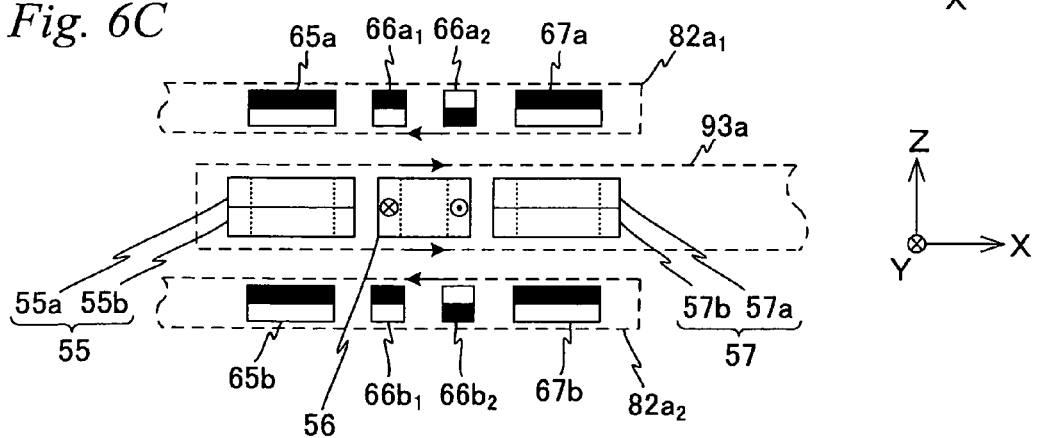
FIG. 6C is a view used to explain a drive principle when a fine movement stage is driven in the X-axis direction.

Further, in a state shown in FIG. 5A, when a clockwise electric current when viewed from the +Z direction is supplied to coil 56 as shown in FIG. 6C, a force in the +X direction (Lorentz force) acts on coil 56, and as its reaction, a force in the −X direction acts on permanent magnets $66a_1$ and $66a_2$, and $66b_1$ and $66b_2$, respectively, fine movement stage WFS is moved in the −X direction with respect to coarse movement stage WSC. Further, when a counterclockwise electric current when viewed from the +Z direction is supplied to coil 56 conversely to the case described above, a force in the +X direction acts on permanent magnets $66a_1$ and $66a_2$, and $66b_1$ and $66b_2$, and fine movement stage WFS is moved in the +X direction with respect to coarse movement stage WCS. Main controller 20 controls the position of fine movement stage WFS in the X-axis direction by controlling the current supplied to each coil.

As is obvious from the description above, in the embodiment, main controller 20 drives fine movement stage WFS in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS in the Y-axis direction, main controller 20 generates a drive force in the Z-axis direction separately from the drive force in the Y-axis direction and makes fine movement stage WFS levitate from coarse movement stage WCS. And main controller 20 drives fine movement stage WFS in the Y-axis direction while maintaining the levitated state of fine movement stage WFS with respect to coarse movement stage WCS, namely a noncontact state, by sequentially switching the coil subject to current supply according to the position of fine movement stage WFS in the Y-axis direction. Further, main controller 20 can also drive fine movement stage WFS independently in the X-axis direction along with the Y-axis direction, in a state where fine movement stage WFS is levitated from coarse movement stage WCS.

Figure 7A:
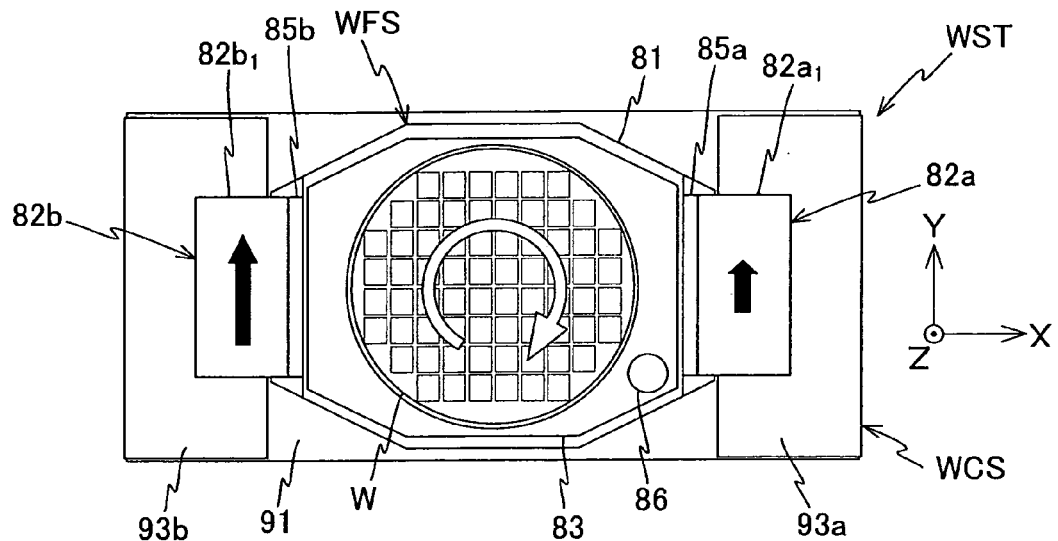
FIG. 7A is a view used to explain an operation when a fine movement stage is rotated around the Z-axis with respect to a coarse movement stage.

Further, as shown in FIG. 7A, for example, main controller 20 can make fine movement stage WFS rotate around the Z-axis (θz rotation) (refer to the outlined arrow in FIG. 7A), by applying a drive force (thrust) in the Y-axis direction having a different magnitude (refer to the black arrows in FIG. 7A) to both mover section 82a on the +X side and mover section 82b on the −X side of fine movement stage WFS. Incidentally, in contrast with FIG. 7A, by making the drive force applied to mover section 82a on the +X side larger than the −X side, fine movement stage WFS can be made to rotate counterclockwise with respect to the Z-axis.

Figure 7B:
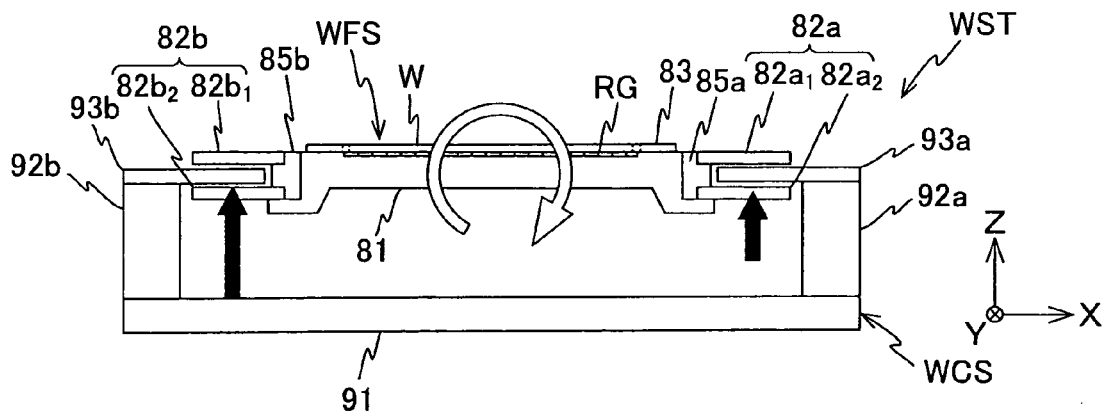
FIG. 7B is a view used to explain an operation when a fine movement stage is rotated around the Y-axis with respect to a coarse movement stage.

Further, as shown in FIG. 7B, main controller 20 can make fine movement stage WFS rotate around the Y-axis ($\theta y$ drive) (refer to the outlined arrow in FIG. 7B), by applying a different levitation force (refer to the black arrows in FIG. 76) to both mover section 82a on the +X side and mover section 82b on the −X side of fine movement stage WFS. Incidentally, in contrast with FIG. 7B, by making the levitation force applied to mover section 82a on the +X side larger than the −X side, fine movement stage WFS can be made to rotate counterclockwise with respect to the Y-axis.

Figure 7C:
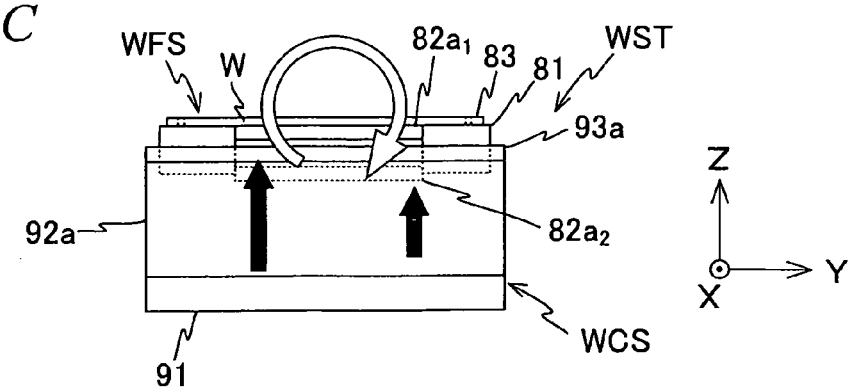
FIG. 7C is a view used to explain an operation when a fine movement stage is rotated around the X-axis with respect to a coarse movement stage.

Furthermore, as shown in FIG. 7C, for example, main controller 20 can make fine movement stage WFS rotate around the X-axis ($\theta x$ drive) (refer to the outlined arrow in FIG. 7C), by applying a different levitation force (refer to the black arrows in FIG. 7C) to both mover sections 82a and 82b of fine movement stage WFS on the +side and the −side in the Y-axis direction. Incidentally, in contrast with FIG. 7C, by making the levitation force applied to mover section 82a (and 82b) on the −Y side smaller than the levitation force on the +Y side, fine movement stage WFS can be made to rotate counterclockwise with respect to the X-axis.

As it can be seen from the description above, in the embodiment, fine movement stage drive system 52 supports fine movement stage WFS by levitation in a non-contact state with respect to coarse movement stage WCS, and can also drive fine movement stage WFS in a non-contact manner in directions of six degrees of freedom (X, Y, Z, $\theta x$, $\theta y$, $\theta z$) with respect to coarse movement stage WCS.

Figure 8:
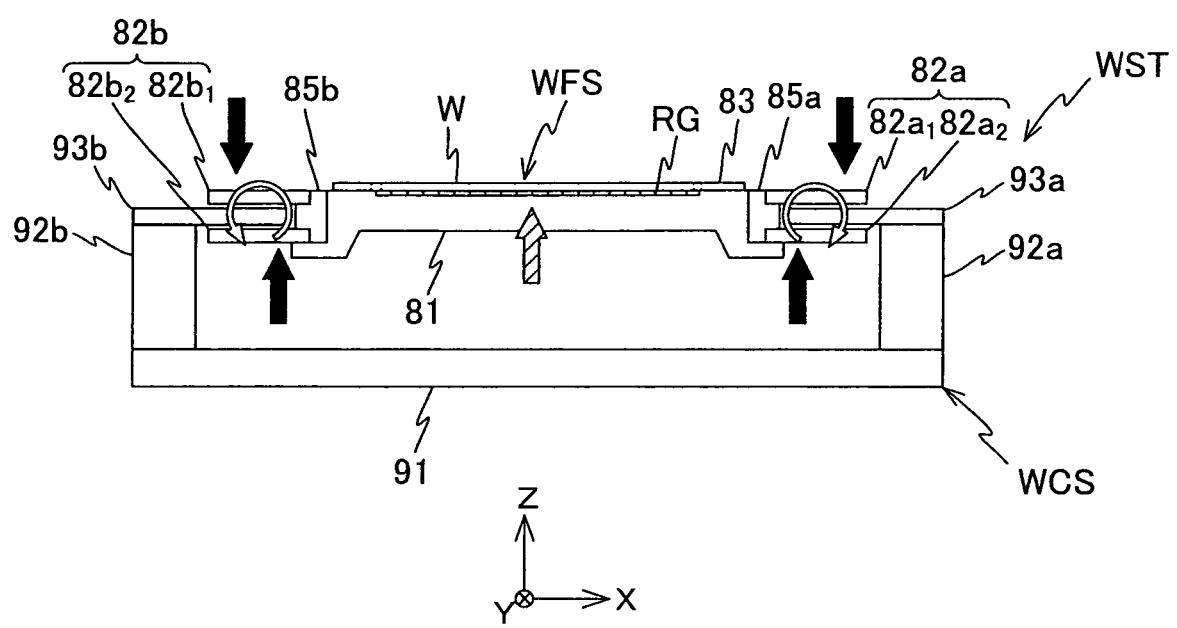
FIG. 8 is a view used to explain an operation when a center section of the fine movement stage is deflected in the +Z direction.

Further, in the embodiment, by supplying electric current to the two lines of coils 55 and 57 (refer to FIG. 4) placed inside stator section 93a in directions opposite to each other when applying the levitation force to fine movement stage WFS, for example, main controller 20 can apply a rotational force (refer to the outlined arrows in FIG. 8) around the Y-axis simultaneously with the levitation force (refer to the black arrows in FIG. 8) with respect to mover section 82a, as shown in FIG. 8. Further, by applying a rotational force around the Y-axis to each of the pair of mover sections 82a and 82b in directions opposite to each other, main controller 20 can deflect the center of fine movement stage WFS in the +Z direction or the −Z direction (refer to the hatched arrow in FIG. 8). Accordingly, as shown in FIG. 8, by bending the center of fine movement stage WFS in the +Z direction, the deflection in the middle part of fine movement stage WFS (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS also becomes large.

Further, when wafer W is deformed by its own weight and the like, there is a risk that the surface of wafer W mounted on fine movement stage WFS will no longer be within the range of the depth of focus of projection optical system PL within the irradiation area (exposure area IA) of illumination light IL. Therefore, similar to the case where main controller 20 deflects the center of fine movement stage WFS in the X-axis direction as described above, by applying a rotational force around the Y-axis to each of the pair of mover sections 82a and 82b in directions opposite to each other, wafer W is deformed to be substantially flat, and the surface of wafer W within exposure area IA can fall within the range of the depth of focus of projection optical system PL. Incidentally, while FIG. 8 shows an example where fine movement stage WFS is bent in the +Z direction (a convex shape), fine movement stage WFS can also be bent in a direction opposite to this (a concave shape) by controlling the direction of the electric current supplied to the coils.

Incidentally, the method of making fine movement stage WFS (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA.

In exposure apparatus 100 of the embodiment, at the time of exposure operation by the step-and-scan method to wafer W, positional information (including the positional information in the $\theta z$ direction) in the XY plane of fine movement stage WFS is measured by main controller 20 using an encoder system 73 (refer to FIG. 3) of fine movement stage position measurement system 70 which will be described later on. The positional information of fine movement stage WFS is sent to main controller 20, which controls the position of fine movement stage WFS based on the positional information.

On the other hand, when wafer stage WST is located outside the measurement area of fine movement stage position measurement system 70, the positional information of wafer stage WST is measured by main controller 20 using wafer stage position measurement system 16 (refer to FIG. 3). As shown in FIG. 1, wafer stage position measurement system 16 includes a laser interferometer which irradiates a measurement beam on a reflection surface formed on the coarse movement stage WCS side surface by mirror-polishing and measures positional information of wafer stage WST in the XY plane. Incidentally, although illustration is omitted in FIG. 1, in actual practice, a Y reflection surface perpendicular to the Y-axis and an X reflection surface perpendicular to the X-axis are formed on coarse movement stage WCS, and corresponding to these surfaces, an X interferometer and a Y interferometer are provided as the laser interferometer that irradiate measurement beams, respectively, on to the X reflection surface and the Y reflection surface. Incidentally, in wafer stage position measurement system 16, for example, the Y interferometer can have a plurality of measurement axes, and positional information (rotational information) in the $\theta z$ direction of wafer stage WST can also be measured, based on an output of each of the measurement axes. Incidentally, the positional information of wafer stage WST in the XY plane can be measured using other measurement devices, such as for example, an encoder system, instead of wafer stage position measurement system 16 described above. In this case, for example, a two-dimensional scale can be placed on the upper surface of base board 12, and an encoder head can be arranged on the bottom surface of coarse movement stage WCS.

Next, a configuration of fine movement stage position measurement system 70 (refer to FIG. 3) including encoder system 73 used to measure the positional information of fine movement stage WFS in the XY plane and laser interferometer system 75 used to measure the positional information of fine movement stage WFS in the Z, $\theta x$, and $\theta y$ directions will be described below. As shown in FIG. 1, fine movement stage position measurement system 70 is equipped with a measurement member (measurement arm) 71 which is inserted in a space inside the coarse movement stage in a state where wafer stage WST is placed below projection optical system PL.

Measurement arm 71 is supported cantilevered (supported in the vicinity of one end) from main frame BD of exposure apparatus 100 via a support section 72. Incidentally, in the case a configuration is employed where the measurement members do not interfere with the movement of the wafer stage, the configuration is not limited to the cantilever support, and both ends in the longitudinal direction can be supported.

Measurement arm 71 is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of the same material that transmits light, such as, for example, a glass member affixed in plurals. Measurement arm 71 is formed solid, except for the portion where the encoder head (an optical system) which will be described later is housed. In the state where wafer stage WST is placed below projection optical system PL as previously described, the tip of measurement arm 71 is inserted into the space of coarse movement stage WCS, and its upper surface faces the lower surface (to be more precise, the lower surface of main body section 81 (not shown in FIG. 1, refer to FIG. 2A and the like) of fine movement stage WFS as shown in FIG. 1. The upper surface of measurement arm 71 is placed almost parallel with the lower surface of fine movement stage WFS, in a state where a predetermined clearance, such as, for example, around several mm, is formed with the lower surface of fine movement stage WFS. Incidentally, the clearance between the upper surface of measurement arm 71 and the lower surface of fine movement stage WFS can be more than or less than several mm.

As shown in FIG. 3, fine movement stage position measurement system 70 is equipped with encoder system 73 which measures the position of fine movement stage WFS in the X-axis direction, the Y-axis direction, and the θz direction, and laser interferometer system 75 which measures the position of fine movement stage WFS in the Z-axis direction, the θx direction, and the θy direction. Encoder system 73 includes an X linear encoder 73x measuring the position of fine movement stage WFS in the X-axis direction, and a pair of Y linear encoders 73ya and 73yb (hereinafter, also appropriately referred to together as Y linear encoder 73y) measuring the position of fine movement stage WFS in the Y-axis direction. In encoder system 73, a head of a diffraction interference type is used that has a configuration similar to an encoder head (hereinafter shortly referred to as a head) disclosed in, for example, U.S. Pat. No. 7,238,931, and PCT International Publication No. 2007/083758 (the corresponding U.S. Patent Application Publication No. 2007/288121) and the like. However, in the embodiment, a light source and a photodetection system (including a photodetector) of the head are placed external to measurement arm 71 as in the description later on, and only an optical system is placed inside measurement arm 71, or more specifically, facing grating RG. Hereinafter, the optical system placed inside measurement arm 71 will be referred to as a head, besides the case when specifying is especially necessary.

Figure 9A:
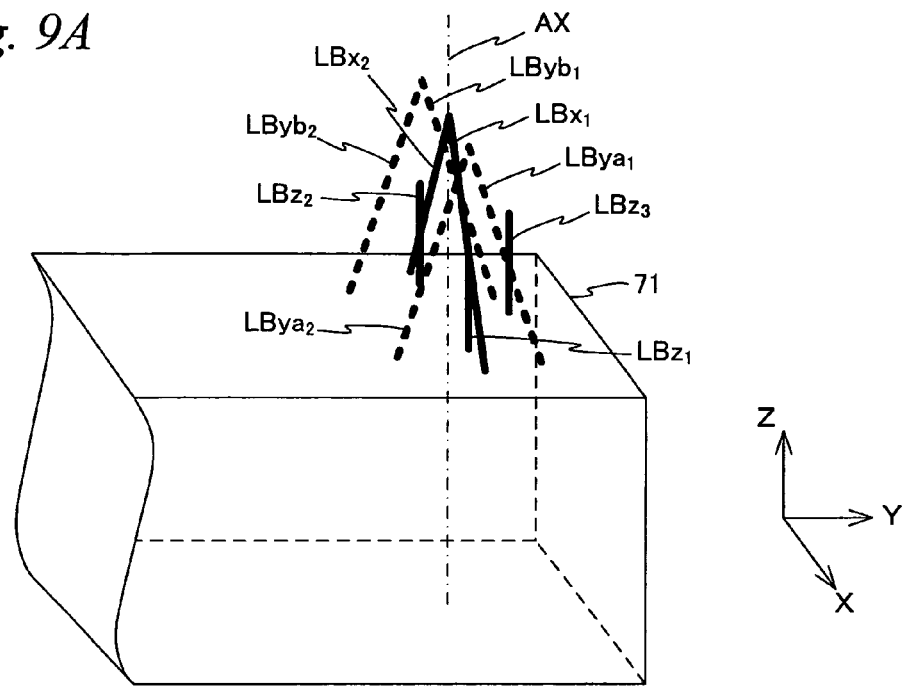
FIG. 9A shows a perspective view of a tip of a measurement arm.
Figure 9B:
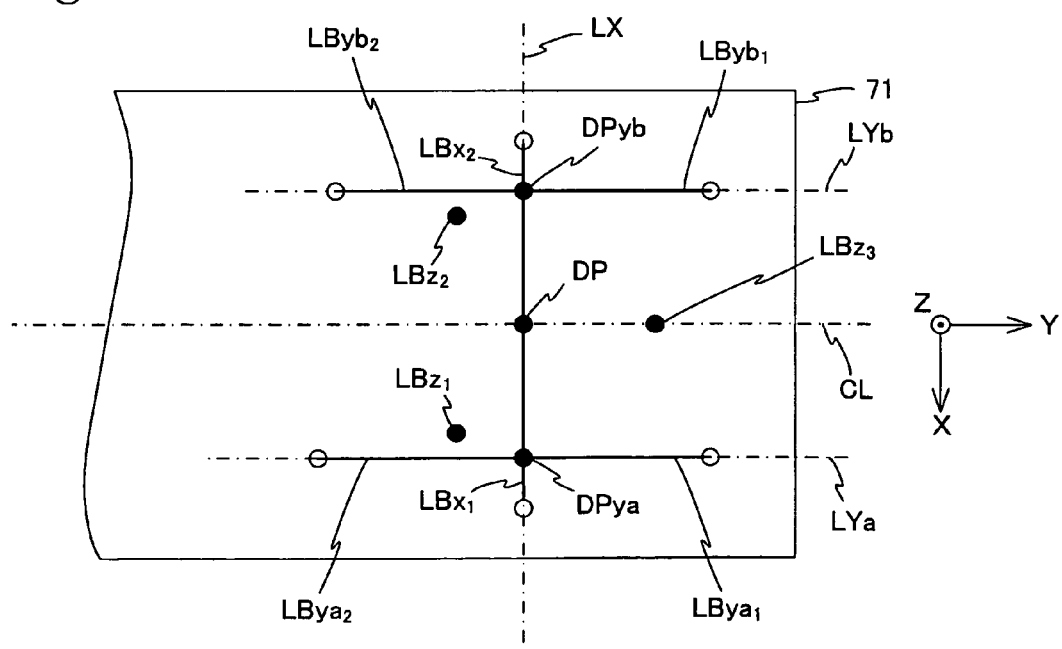
FIG. 9B is a planar view when viewed from the +Z direction of an upper surface of the tip of the measurement arm.

FIG. 9A shows a tip of measurement arm 71 in a perspective view, and FIG. 9B shows an upper surface of the tip of measurement arm 71 in a planar view when viewed from the +Z direction. Encoder system 73 measures the position of fine movement stage WFS in the X-axis direction using one X head 77x (refer to FIGS. 10A and 10B), and the position in the Y-axis direction using a pair of Y heads 77ya and 77yb (refer to FIG. 10B). More specifically, X linear encoder 73x previously described is configured by X head 77x which measures the position of fine movement stage WFS in the X-axis direction using an X diffraction grating of grating RG, and the pair of Y linear encoders 73ya and 73yb is configured by the pair of Y heads 77ya and 77yb which measures the position of fine movement stage WFS in the Y-axis direction using a Y diffraction grating of grating RG.

As shown in FIGS. 9A and 9B, X head 77x irradiates measurement beams $LBx_1$ and $LBx_2$ (indicated by a solid line in FIG. 9A) on grating RG from two points (refer to the white circles in FIG. 9B) on a straight line LX parallel to the X-axis that are at an equal distance from a center line CL of measurement arm 71. Measurement beams $LBx_1$ and $LBx_2$ are irradiated on the same irradiation point on grating RG (refer to FIG. 10A). The irradiation point of measurement beams $LBx_1$ and $LBx_2$, that is, a detection point of X head 77x (refer to reference code DP in FIG. 9B) coincides with an exposure position which is the center of an irradiation area (exposure area) IA of illumination light IL irradiated on wafer W (refer to FIG. 1). Incidentally, while measurement beams $LBx_1$ and $LBx_2$ are actually refracted at a boundary and the like of main body section 81 and an atmospheric layer, it is shown simplified in FIG. 10A and the like.

Figure 10A:
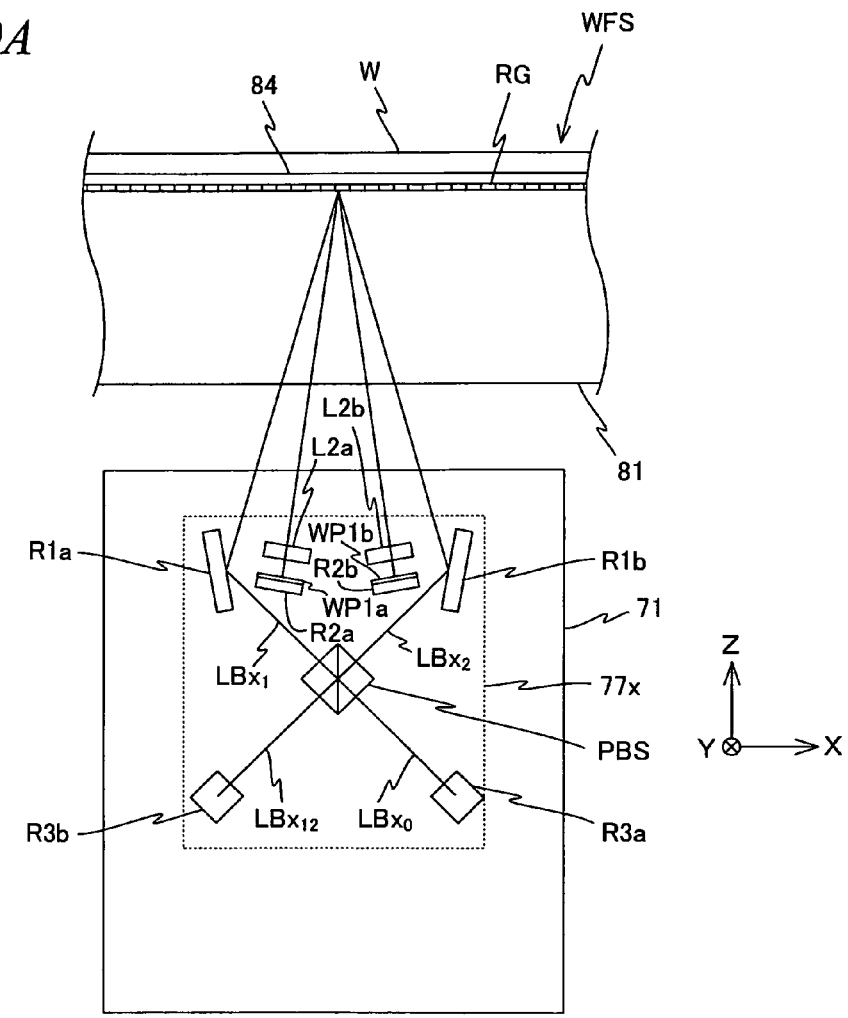
FIG. 10A is a view showing a rough configuration of a X head 77x.
Figure 10B:
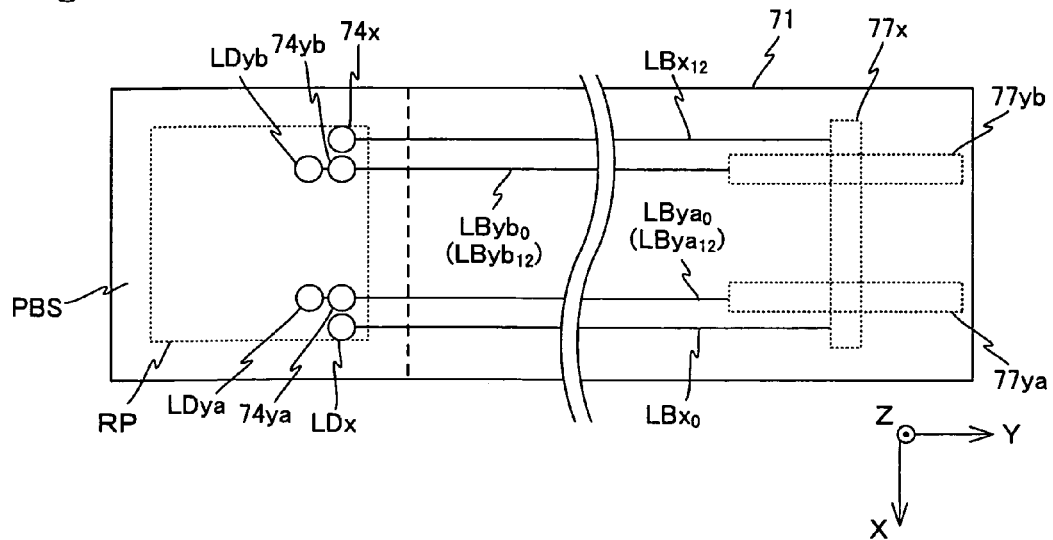
FIG. 10B is a view used to explain a placement of each of the X head 77x, Y heads 77ya and 77yb inside the measurement arm.

As shown in FIG. 10B, each of the pair of Y heads 77ya and 77yb are placed on the +X side and the −X side of center line CL of measurement arm 71. As shown in FIGS. 9A and 9B, Y head 77ya is placed on a straight line LYa which is parallel to the Y-axis, and irradiates measurement beams $LBya_1$ and $LBya_2$ that are each shown by a broken line in FIG. 9A on a common irradiation point on grating RG from two points (refer to the white circles in FIG. 9B) which are distanced equally from straight line LX. The irradiation point of measurement beams $LBya_1$ and $LBya_2$, that is, a detection point of Y head 77ya is shown by reference code DPya in FIG. 9B.

Similar to Y head 77ya, Y head 77yb is placed on a straight line LYb which is located the same distance away from center line CL of measurement arm 71 as straight line LYa and is parallel to the Y-axis, and irradiates measurement beams $LByb_1$ and $LByb_2$ on a common irradiation point DPyb on grating RG from two points (refer to the white circles in FIG. 9B) which are distanced equally from straight line LX. As shown in FIG. 9B, detection points DPya and DPyb of each of the measurement beams $LByb_1$ and $LByb_2$, and measurement beams $LByb_1$ and $LByb_2$ are placed on straight line LX which is parallel to the X-axis. Now, main controller 20 determines the position of fine movement stage WFS in the Y-axis direction, based on an average of the measurement values of the two Y heads 77ya and 77yb. Accordingly, in the embodiment, the position of fine movement stage WFS in the Y-axis direction is measured with a midpoint of detection points DPya and DPyb serving as a substantial measurement point. And, the midpoint of detection points DPya and DPyb according to Y heads 77ya and 77yb coincides with irradiation point DP of measurement beams $LBx_1$ and $LBX_2$ on grating RG. More specifically, in the embodiment, there is a common detection point regarding measurement of positional information of fine movement stage WFS in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS in the XY plane, directly under (at the back side of) the exposure position when transferring a pattern of reticle R on a predetermined shot area of wafer W mounted on fine movement stage WFS. Further, main controller 20 measures a rotational amount of fine movement stage WFS in the θz direction, based on a difference of the measurement values of the pair of Y heads 77ya and 77yb, which are placed apart in the X-axis direction and measure the position of fine movement stage WFS in the Y-axis direction, respectively.

A configuration of three heads 77x, 77ya, and 77yb which configure encoder system 73 will now be described. FIG. 10A representatively shows a rough configuration of X head 77x, which represents three heads 77x, 77ya, and 77yb. Further, FIG. 10B shows a placement of each of the X head 77x, and Y heads 77ya and 77yb within measurement arm 71.

As shown in FIG. 10A, X head 77x is equipped with a polarization beam splitter PBS whose separation plane is parallel to the YZ plane, a pair of reflection mirrors R1a and R1b, lenses L2a and L2b, quarter wavelength plates (hereinafter, described as a λ/4 plate) WP1a and WP1b, refection mirrors R2a and R2b, and refection mirrors R3a and R3b and the like, and these optical elements are placed in a predetermined positional relation. Y heads 77ya and 77yb also have an optical system with a similar structure. As shown in FIGS. 10A and B, X head 77x, Y heads 77ya and 77yb are unitized and each fixed inside of measurement arm 71.

As shown in FIG. 10B, in X head 77x (X encoder 73x), a laser beam $LBx_0$ is emitted in the −Z direction from a light source LDx provided on the upper surface (or above) at the end on the −Y side of measurement arm 71, and its optical path is bent to become parallel with the Y-axis direction via reflection plane RP which is provided inclined at an angle of 45 degrees with respect to the XY plane. This laser beam $LBx_0$ travels through the solid section inside measurement arm 71 in parallel with the longitudinal direction (the Y-axis direction) of measurement arm 71, and reaches reflecting mirror R3a shown in FIG. 10A. Then, the optical path of laser beam $LBx_0$ is bent by reflecting mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS, via reflection mirror R1a, and measurement beam $LBx_2$ reflected off polarization beam splitter PBS reaches grating RG via reflection mirror R1b. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WP1b again and reach polarization beam splitter PBS by tracing the same optical path in the reversed direction.

The polarization direction of each of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. Accordingly, the first-order diffraction beams of each of the measurement beams $LBx_1$ and $LBx_2$ are coaxially synthesized as a synthetic beam $LBx_{12}$. Synthetic beam $LBx_{12}$ has its optical path bent by reflecting mirror R3b so it becomes parallel to the Y-axis, travels inside measurement arm 71 parallel to the Y-axis, and then is sent to an X photodetection system 74x provided on the upper surface (or above) at the end on the −Y side of measurement arm 71 shown in FIG. 10B via reflection plane RP previously described.

In X photodetection system 74x, the polarization direction of the first-order diffraction beams of measurement beams $LBx_1$ and $LBx_2$ synthesized as synthetic beam $LBx_{12}$ is arranged by a polarizer (analyzer) (not shown) and the beams interfere with each other so as to form an interference light, which is detected by the photodetector and is converted into an electric signal in accordance with the intensity of the interference light. When fine movement stage WFS moves in the measurement direction (in this case, the X-axis direction) here, a phase difference between the two beams changes, which changes the intensity of the interference light. This change of the intensity of the interference light is supplied to main controller 20 (refer to FIG. 3) as positional information related to the X-axis direction of fine movement stage WFS.

As shown in FIG. 10B, laser beams $LBya_0$ and $LByb_0$, which are emitted from light sources LDya and LDyb, respectively, and whose optical paths are bent by an angle of 90 degrees so as to become parallel to the Y-axis by reflection plane RP1 previously described, are incident on Y heads 77ya and 77yb, and similar to the previous description, synthetic beams $LBya_{12}$ and $LByb_{12}$ of the first-order diffraction beams by grating RG (Y diffraction grating) of each of the measurement beams split by polarization by the polarization beam splitter axe output from Y heads 77ya and 77yb, respectively, and return to Y photodetection system 74ya, 74yb. In this case, as shown in FIG. 10B, light source LDya and photodetection system 74ya, and light source LDyb and photodetection system 74yb are placed arranged alongside in the Y-axis direction, respectively. Accordingly, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 10B. Further, as described above, Y heads 77ya and 77yb, optical paths are appropriately bent (omitted in drawings) inside so that laser beams $LBya_0$ and $LByb_0$ emitted from the light source and synthetic beams $LBya_{12}$ and $LByb_{12}$ returning to Y photodetection systems 74ya and 74yb pass optical paths which are parallel and distanced apart in the Z-axis direction.

As shown in FIG. 9A, laser interferometer system 75 makes three measurement beams $LBz_1$, $LBz_2$, and $LBz_3$ enter the lower surface of fine movement stage WFS from the tip of measurement arm 71. Laser interferometer system 75 is equipped with three laser interferometers 75a to 75c (refer to FIG. 3) that irradiate three measurement beams $LBz_1$, $LBz_2$, and $LBz_3$, respectively.

In laser interferometer system 75, three measurement beams $LBz_1$, $LBz_2$, and $LBz_3$ are emitted in parallel with the Z-axis from each of the three points that are not collinear on the upper surface of measurement arm 71, as shown in FIGS. 9A and 9B. Now, as shown in FIG. 9B, three measurement beams $LBz_1$, $LBz_2$, and $LBz_3$ are each irradiated from positions which are the apexes of an isosceles triangle (or an equilateral triangle) whose centroid coincides with the exposure position which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, and information on the rotational amount in the θz direction and the θy direction of fine movement stage WFS, using laser interferometer system 75. Incidentally, laser interferometers 75a to 75c are provided on the upper surface (for above) at the end on the −Y side of measurement arm 71. Measurement beams $LBz_1$, $LBz_2$, and $LBz_3$ emitted in the −Z direction from laser interferometers 75a to 75c travel within measurement arm 71 along the Y-axis direction via reflection plane RP previously described, and each of their optical paths is bent so that the beams are emitted from the three points described above.

In the embodiment, on the lower surface of fine movement stage WFS, a wavelength selection filter (omitted in drawings) which transmits each measurement beam from encoder system 73 and blocks the transmission of each measurement beam from laser interferometer system 75 is provided. In this case, the wavelength selective filter also serves as a reflection surface for each of the measurement beams from laser interferometer system 75. As the wavelength selection filter, a thin film and the like having wavelength-selectivity is used, and in the embodiment, the filter is provided, for example, on one surface of the transparent plate (main body section 81), and grating RG is placed on the wafer holder side with respect to the one surface.

As it can be seen from the description so far, main controller 20 can measure the position of fine movement stage WFS in directions of six degrees of freedom by using encoder system 73 and laser interferometer system 75 of fine movement stage position measurement system 70. In this case, since the optical path lengths in the air of the measurement beams are extremely short and also are almost equal to each other in encoder system 73, the influence of air fluctuation can mostly be ignored. Accordingly, by encoder system 73, positional information (including the θz direction) of fine movement stage WFS within the XY plane can be measured with high accuracy. Further, because the substantial detection points on the grating in the X-axis direction and the Y-axis direction by encoder system 73 and detection points on the lower surface of fine movement stage WFS lower surface in the Z-axis direction by laser interferometer system 75 coincide with the center (exposure position) of exposure area IA, respectively, generation of the so-called Abbe error is suppressed to a substantially ignorable degree. Accordingly, by using fine movement stage position measurement system 70, main controller 20 can measure the position of fine movement stage WFS in the X-axis direction, the Y-axis direction, and the Z-axis direction with high precision, without any Abbe errors.

In exposure apparatus 100 of the embodiment which it is configured in the manner described above, on manufacturing a device, first of all, main controller 20 detects the second fiducial marks on measurement plate 86 of fine movement stage WFS, using wafer alignment system ALG. Subsequently, main controller 20 performs wafer alignment (Enhanced Global Alignment (EGA) and the like which is disclosed in, for example, U.S. Pat. No. 4,780,617 and the like) and the like using wafer alignment system ALG. Incidentally, in exposure apparatus 100 of the embodiment, because wafer alignment system ALG is placed away in the Y-axis direction from projection unit PU, position measurement of fine movement stage WFS by the encoder system (measurement arm) of fine movement stage position measurement system 70 cannot be performed when performing the wafer alignment. Therefore, in exposure apparatus 100, a second fine movement stage position measurement system (omitted in drawings) including a measurement arm having a configuration similar to measurement arm 71 of fine movement stage position measurement system 70 is arranged in the vicinity of wafer alignment system ALG, and position measurement of the fine movement stage within the XY plane is performed using this at the time of the wafer alignment. However, besides this, wafer alignment can be performed while measuring the position of wafer W via wafer stage position measurement system 16 previously described. Further, because wafer alignment system ALG and projection unit PU are distanced, main controller 20 converts array coordinates of each shot area on wafer W acquired from the wafer alignment into array coordinates which are based on the second fiducial marks.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS and the like. Then, main controller 20 performs exposure operation by the step-and-scan method, based on results of the reticle alignment and the results of the wafer alignment (array coordinates which uses the second fiducial marks of each of the shot areas on wafer W as a reference), and transfers the pattern of reticle R on each of the plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. In this case, scanning exposure by the liquid immersion exposure is performed. In exposure apparatus 100 of the embodiment, during the series of exposure operations described above, main controller 20 measures the position of fine movement stage WFS (wafer W) using fine movement stage position measurement system 70, and the position of wafer W is controlled based on the measurement results.

Figure 11A:
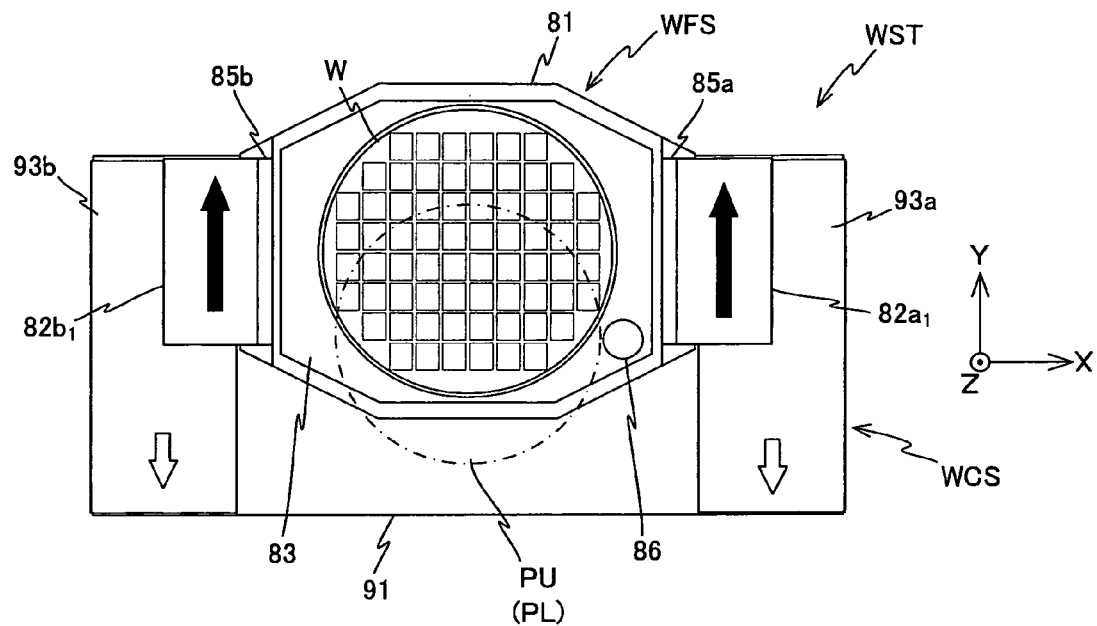
FIG. 11A is a view used to explain a drive method of a wafer at the time of scanning exposure.

Incidentally, while wafer W has to be scanned with high acceleration in the Y-axis direction at the time of scanning exposure operation described above, in exposure apparatus 100 of the embodiment, main controller 20 scans wafer W in the Y-axis direction by driving (refer to the black arrows in FIG. 11A) only fine movement stage WFS in the Y-axis direction (and in directions of the other five degrees of freedom, if necessary), without driving coarse movement stage WCS in principle at the time of scanning exposure operation as shown in FIG. 11A. This is because when moving only fine movement stage WFS, weight of the drive object is lighter when comparing with the case where coarse movement stage WCS is driven, which allows an advantage of being able to drive wafer W with high acceleration. Further, because position measuring accuracy of fine movement stage position measurement system 70 is higher than wafer stage position measurement system 16 as previously described, it is advantageous to drive fine movement stage WFS at the time of scanning exposure. Incidentally, at the time of this scanning exposure, coarse movement stage WCS is driven to the opposite side of fine movement stage WFS by an operation of a reaction force (refer to the outlined arrows in FIG. 11A) by the drive of fine movement stage WFS. More specifically, because coarse movement stage WCS functions as a countermass, momentum of the system consisting of the entire wafer stage WST is conserved and centroid shift does not occur, therefore, inconveniences such as unbalanced load acting on base board 12 by the scanning drive of fine movement stage WFS do not occur.

Figure 11B:
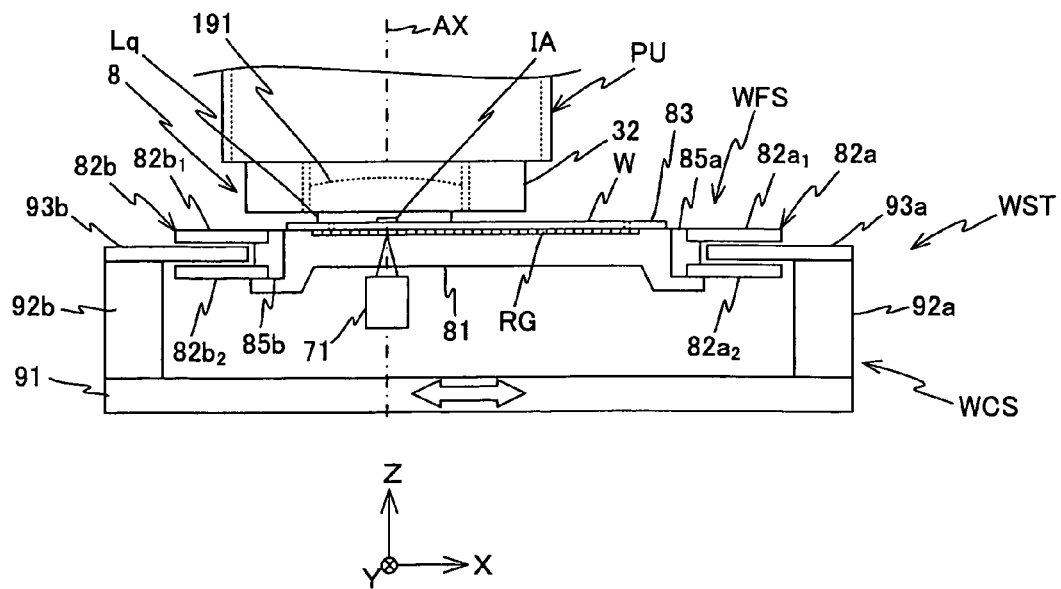
FIG. 11B is a view used to explain a driving method of a wafer at the time of stepping.

Meanwhile, when the movement (stepping) operation between shots in the X-axis direction is performed, because movement capacity in the X-axis direction of fine movement stage WFS is small, main controller 20 moves wafer W in the X-axis direction by driving coarse movement stage WCS in the X-axis direction as shown in FIG. 11B.

As described above, according to exposure apparatus 100 of the embodiment, the positional information of fine movement stage WFS in the XY plane is measured by main controller 20, using encoder system 73 of fine movement stage position measurement system 70 having measurement arm 71 which faces grating RG placed on fine movement stage WFS. In this case, the irradiation point of the measurement beams of each of the heads of encoder system 73 and laser interferometer system 75 configuring fine movement stage position measurement system 70 emitted from measurement arm 71 on grating RG coincides with the center (exposure position) of irradiation area (exposure area) IA of exposure light IL irradiated on wafer W. Accordingly, main controller 20 can measure the positional information of fine movement stage WFS with high accuracy, without being affected by the so-called Abbe error. Further, in this case, because space is formed inside coarse movement stage WCS and each of the heads of fine movement stage position measurement system 70 are placed in this space, there is only space between fine movement stage WFS and the heads. Accordingly, each of the heads can be placed close to fine movement stage WFS (grating RG), which allows measurement of the positional information of fine movement stage WFS by fine movement stage position measurement system 70 with high precision, which in its turn allows a highly precise drive of fine movement stage WFS via coarse movement stage drive system 51 and/or fine movement stage drive system 52 by main controller 20. Further, because optical path lengths in the atmosphere of the measurement beams of each of the heads of encoder system 73 can be made extremely short by placing measurement arm 71 right under grating RG, the influence of air fluctuation is reduced, and also in this point, the positional information of fine movement stage WFS can be measured with high accuracy.

Further, according to exposure apparatus 100 of the embodiment, because fine movement stage WFS can be driven with good precision, it becomes possible to drive wafer W mounted on this fine movement stage WFS in synchronization with reticle stage RST (reticle R) with good precision, and to transfer a pattern of reticle R onto wafer W with good precision by scanning exposure.

Incidentally, in the embodiment above, while the case has been described where the exposure apparatus is equipped with measurement arm 71 which is entirely made of glass and in which light can proceed inside as an arm member configuring fine movement stage position measurement system 70, the present invention is not limited to this. For example, at least only the part where each of the laser beams previously described proceed in the arm member (measurement arm) has to be made of a solid member which can pass through light, and the other sections, for example, can be a member that does not transmit light, or can have a hollow structure. Further, as an arm member, for example, a light source or a photodetector can be built in the tip of the arm member, as long as a measurement beam can be irradiated from the section facing the grating. In this case, the measurement beam of the encoder does not have to proceed inside the arm member.

Further, in the measurement arm, the part (beam optical path segment) where each laser beam proceeds can be hollow. Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path).

Furthermore, the arm member does not have to have a prismatic shape, and for example, can be a pillar shape with a circular cross section. Further, the section does not have to be a uniform section.

Further, in the embodiment above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. Therefore, a modified example of encoder system 73 configured using a 2D head will be described.

Figure 12A:
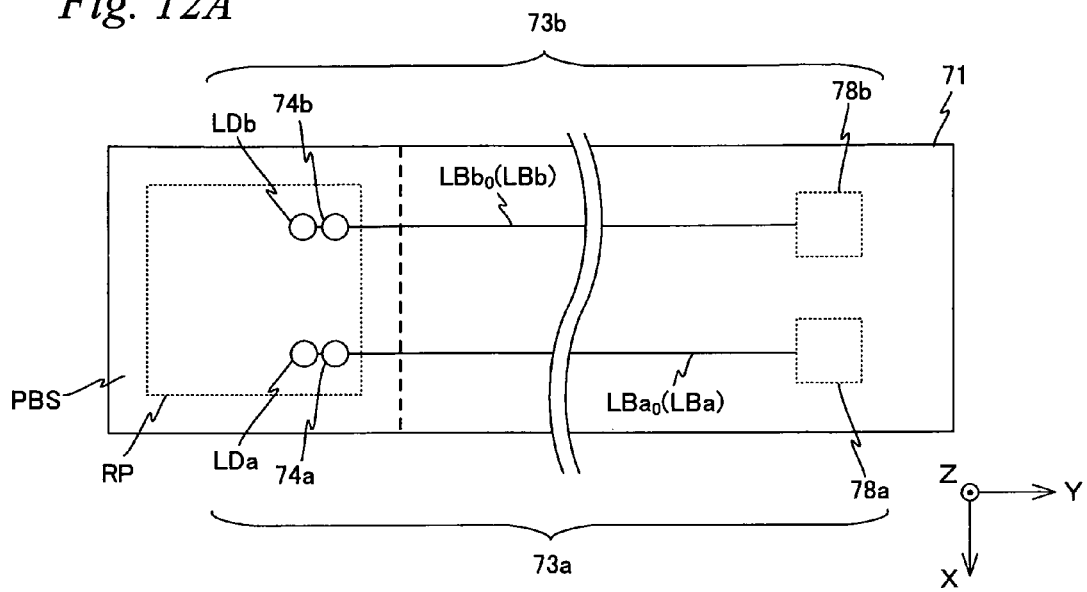
FIG. 12A is a view used to explain a placement of heads 78a and 78b configuring an encoder system related to a first modified example inside the measurement arm.

FIG. 12A shows a schematic configuration of an encoder system related to a first modified example. This encoder system includes two encoder systems (to be referred to as a first and second encoder). A first encoder 73a includes a light source LDa, a photodetection system 74a, and a 2D head 78a. A second encoder 73b includes a light source LDb, a photodetection system 74b, and a 2D head 78b. In this case, light source LDa and photodetection system 74a are placed facing the +X and the −Y ends of the upper surface (the +Z surface) of measurement arm 71. Light source LDb and photodetection system 74b are placed facing the −X and the −Y ends of the upper surface (the +Z surface) of measurement arm 71. 2D head 78a is placed in measurement arm 71 in the vicinity of the +X and +Y ends, and 2D head 78b is placed in the vicinity of the −X and +Y ends.

Figure 12B:
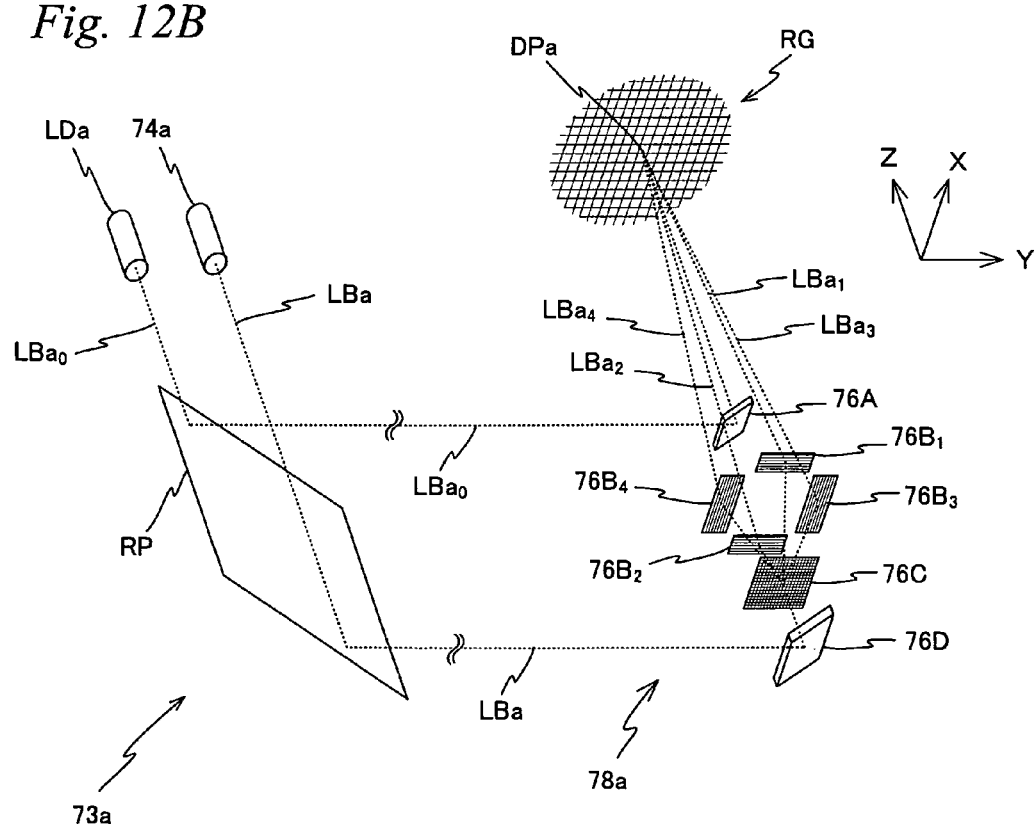

FIG. 12B is a schematic configuration of the first encoder 73a and 2D head 78a included in the encoder. As shown in FIGS. 12A and 12B, in the first encoder 73a, a laser beam $LBa_0$ is emitted in the −Z direction from light source LDa. Laser beam $LBa_0$ is reflected by a reflection surface RP arranged inclined at an angle of 45 degrees with respect to the XY plane on the −Y end in measurement arm 71 and its optical path is bent toward the +Y direction, and then proceeds in the +Y direction inside the solid part of measurement arm 71 and enters 2D head 78a.

2D head 78a is a so-called three-grating type encoder head. As shown in FIG. 12B, 2D head 78a includes a reflection surface 76A, fixed gratings $76B_1$ to $76B_4$, a two-dimensional grating (a reference grating) 76C, and a reflecting plate 76D and the like. Fixed gratings $76B_1$ and $76B_2$, and $76B_3$ and $76B_4$, here, are a transmission-type diffraction grating whose periodic direction is in the X-axis direction and the Y-axis direction, respectively. Further, two-dimensional grating (reference grating) 76C is a transmission-type two-dimensional grating on which a diffraction grating having a periodic direction in the X-axis direction and a diffraction grating having a periodic direction in the Y-axis direction have been formed.

Figure 13:
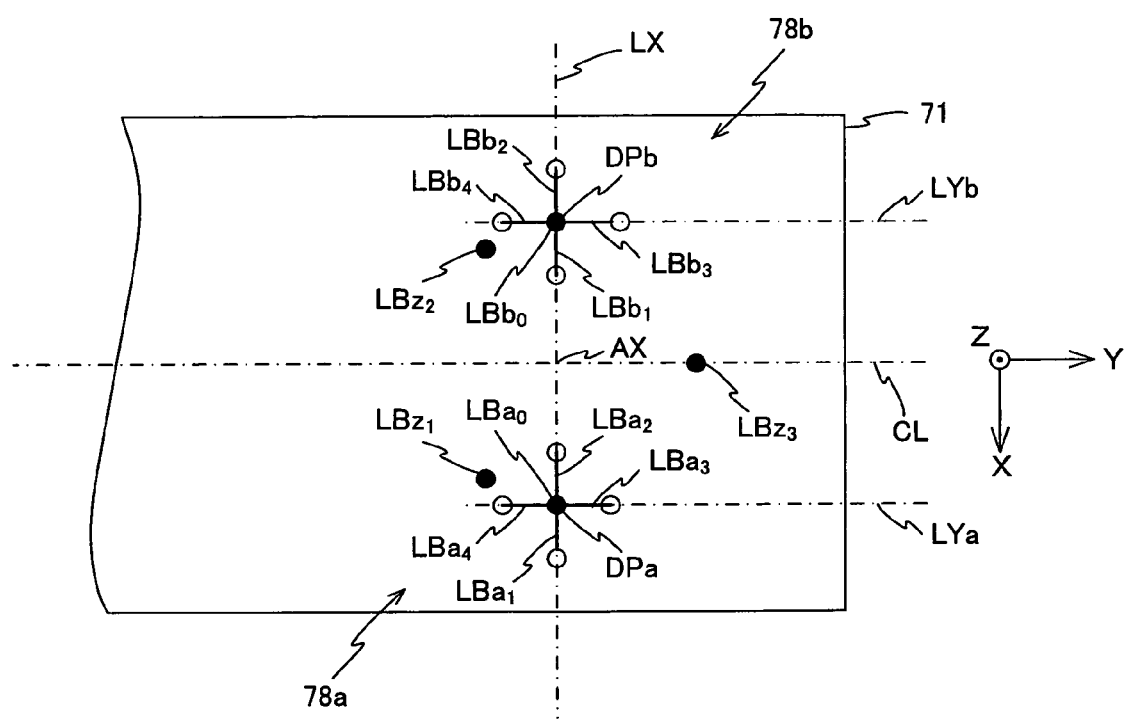
FIG. 13 is a planar view of an upper surface of a tip of the measurement arm related to the first modified example when viewed from the +Z direction.

Laser beam $LBa_0$ which has entered 2D head 78a is reflected by reflection surface 76A, and is emitted from the upper surface (the +Z surface) of measurement arm 71 (omitted in FIG. 12B) and then is irradiated on point DPa on grating RG as a measurement beam. This generates diffraction light in the periodic direction (the X-axis direction) of the X diffraction grating and the periodic direction (the Y-axis direction) of the Y diffraction grating of grating RG. FIG. 13 shows the upper surface (the +Z surface) of the tip of measurement arm 71 on which 2D head 78a (and 78b) is placed. FIGS. 12B and 13 show ±1st order diffraction lights $LBa_1$ and $LBa_2$ generated in the X-axis direction (a direction parallel to a reference axis LX in FIG. 13) and ±1st order diffraction lights $LBa_3$ and $LBa_4$ generated in the Y-axis direction (a direction parallel to a reference axis LYa in FIG. 13).

Diffraction lights $LBa_1$ to $LBa_4$ return inside 2D head 78a via the upper surface (the +Z surface) of measurement arm 71 (omitted in FIG. 12B), or more particularly, passing through a point on the upper surface of measurement arm 71, indicated by a white circle in FIG. 13. And diffraction lights $LBa_1$ to $LBa_4$ are diffracted by fixed gratings $76B_1$ to $76B_4$, respectively, and then proceed toward two-dimensional grating (reference grating) 76C. To be more precise, by the +1st order diffraction light $LBa_1$ entering fixed grating $76B_3$, and the −1st order diffraction light $LBa_2$ entering fixed grating $76B_2$, a −1st order diffraction light and a +1st order diffraction light are generated from fixed grating $76B_1$ and $76B_2$, respectively, at an angle of emergence symmetric to the Z-axis within the XZ plane, and these diffraction lights are incident on the same point on two-dimensional grating (reference grating) 76C. Further, by the +1st order diffraction light $LBa_3$ entering fixed grating $76B_3$ and the −1st order diffraction light $LBa_4$ entering fixed grating $76B_4$, a −1st order diffraction light and a +1st order diffraction light are generated from fixed grating $76B_3$ and $76B_4$, respectively, at an angle of emergence symmetric to the Z-axis within the YZ plane, and these diffraction lights are incident on the same point on two-dimensional grating (reference grating) 76C.

Diffraction lights $LBa_1$ to $LBa_4$ are incident on the same point on two-dimensional grating (reference grating) 76C, and are coaxially synthesized. To be more precise, by diffraction lights $LBa_1$ and $LBa_2$ entering two-dimensional grating 76C, a +1st order diffraction light and a −1st order diffraction light are generated in the Z-axis direction, respectively. Similarly, by diffraction lights $LBa_3$ and $LBa_4$ entering two-dimensional grating 76C, a +1st order diffraction light and a −1st order diffraction light are generated in the Z-axis direction. These diffraction lights which are generated are coaxially synthesized.

Now, a diffraction angle (angle of emergence of diffraction lights $LBa_1$ to $LBa_4$) of measurement beam $LBa_0$ at grating RG is uniquely decided by a wavelength of measurement beam $LBa_0$ and a pitch of diffraction grating of grating RG. Similarly, the diffraction angle (the bending angle of the optical path) of diffraction lights $LBa_1$ to $LBa_1$ at fixed gratings $76B_1$ to $76B_4$ is uniquely decided by a wavelength of measurement beam $LBa_0$ and a pitch of fixed gratings $76B_1$ to $76B_4$. Further, the diffraction angle (the bending angle of the optical path) of diffraction lights $LBa_1$ to $LBa_4$ at two-dimensional grating (reference grating) 76C is uniquely decided by a wavelength of measurement beam $LBa_0$ and a pitch of two-dimensional grating 76C. Accordingly, the pitch of fixed gratings $76B_1$ to $76B_4$ and two-dimensional grating (reference grating) 76C is decided appropriately, in accordance with the wavelength of measurement beam $LBa_0$ and the pitch of the diffraction grating of grating RG, so that diffraction lights $LBa_1$ to $LBa_4$ are coaxially synthesized at two-dimensional grating (reference grating) 76C.

Diffraction lights $LBa_1$ to $LBa_4$ (referred to as synthesized light LBa) which are coaxially synthesized are reflected by reflecting plate 76D, and the optical path is bent to the −Y side. Synthesized light LBa proceeds through the solid part inside measurement arm 71 to the −Y direction and reaches photodetection system 74a, via reflection surface RP and the upper surface (the +Z surface) of measurement arm 71 (omitted in FIG. 12B).

Synthesized light LBa is received by a two-dimensional light receiving element such as a quartered light receiving element, a CCD or the like in photodetection system 74a. In this case, a two-dimensional Moire pattern (checkered pattern) appears on the photodetection surface of the light receiving element. This two-dimensional pattern changes in accordance with the position of grating RG in the X-axis direction and the Y-axis direction. This change is measured by the light receiving element, and the measurement results are supplied to math controller 20 as the positional information (however, irradiation point DPa of measurement beam $LBa_0$ is to be the measurement point) of fine movement stage WFS in the X-axis direction and the Y-axis direction.

The second encoder 73b is configured in a similar manner as the first encoder 73a. However, the second encoder 73b irradiates measurement beam $LBb_0$ emitted from light source LDb on point DPb (refer to FIG. 13) on grating RG, via 2D head 78b. Then, the second encoder 73b synthesizes the diffraction light generated at grating RG via 2D head 78b, and receives the synthesized light using photodetection system 74b, via reflection surface RP. Accordingly, from the second encoder 73b, positional information of fine movement stage WFS in the X-axis direction and the Y-axis direction, with irradiation point DPb of measurement beam $LBb_0$ serving as the measurement point, is supplied to main controller 20.

As shown in FIG. 13, irradiation points DPa and DPb of measurement beams $LBa_0$ and $LBb_0$ on grating RG are placed on reference axis LX, which passes through the center (optical axis AX) of exposure area IA and is parallel to the X-axis within the XY plane. In this case, irradiation points DPa and DPb are at positions equidistant from the center (optical axis AX) of exposure area IA on the ±X side, respectively. Therefore, main controller 20 obtains positional information of fine movement stage WFS in the X-axis direction and the Y-axis direction with the center (optical axis AX) of exposure area IA serving as the substantial measurement point, from the average of the measurement results of the first and second encoders 73a and 73b. Furthermore, main controller 20 obtains positional information of fine movement stage WFS in the θz direction with the center (optical axis AX) of exposure area IA serving as the substantial measurement point, from the measurement results of the first and second encoders 73a and 73b.

Accordingly, by using the encoder system related to the first modified example, main controller 20 can constantly perform positional information measurement of fine movement stage WFS within the XY plane at the center (optical axis AX) of exposure area IA when exposing wafer W mounted on fine movement stage WFS, as in the case previously described when encoder system 73 is used.

Figure 14A:
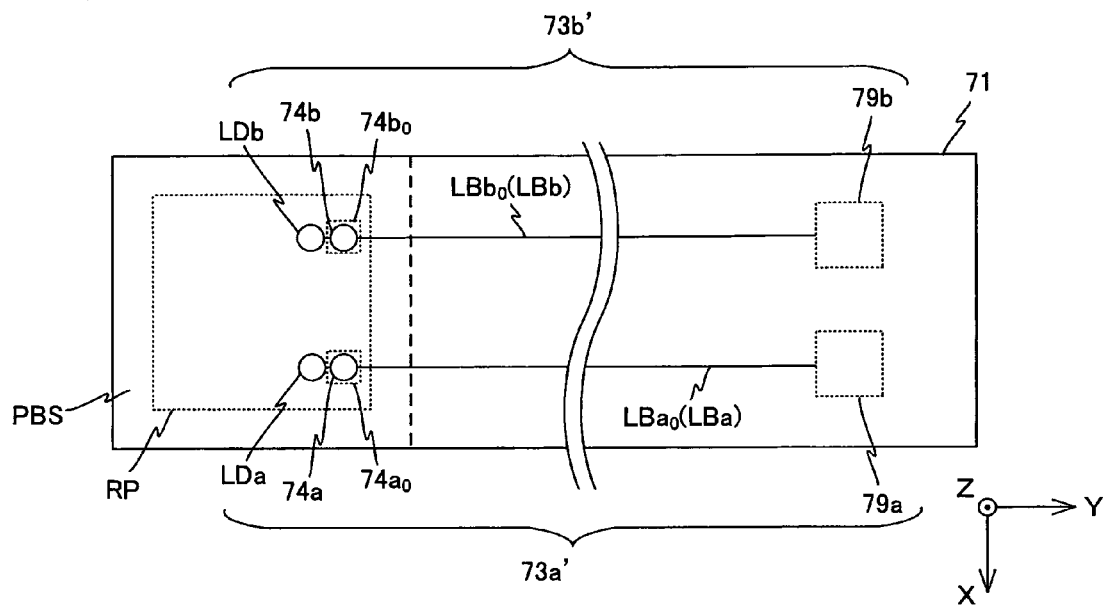
FIG. 14A is a view used to explain a placement of heads 79a and 79b configuring an encoder system related to a second modified example inside the measurement arm.

FIG. 14A shows a schematic configuration of an encoder system related to a second modified example. This encoder system includes two encoder systems (to be referred to as a first and second encoder), as in the encoder system related to the first modified example. The same or similar reference numerals will be used, here, for the same or similar component parts as in the first modified example.

A first encoder 73a' includes a light source LDa, photodetection system 74a, and a 2D head 79a, and a second encoder 73b' includes a light source LDb, a photodetection system 74b, and a 2D head 79b. In this case, light source LDa and photodetection system 74a are placed facing the +X and the −Y ends of the upper surface (the +Z surface) of measurement arm 71, as in the first modified example. Light source LDb and photodetection system 74b are placed facing the −X and the −Y ends of the upper surface (the +Z surface) of measurement arm 71. 2D head 79a is placed in measurement arm 71 in the vicinity of the +X and +Y ends, and 2D head 79b is placed in the vicinity of the −X and +Y ends in measurement arm 71.

Figure 14B:
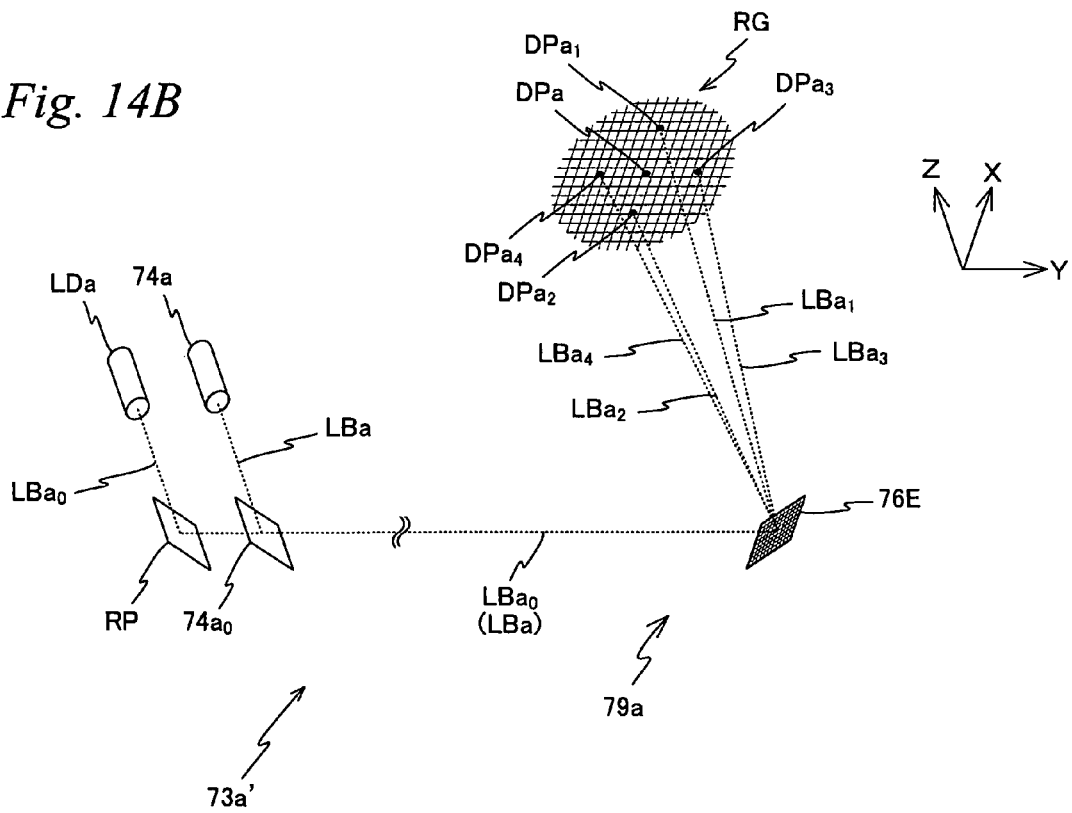

FIG. 14B is a schematic configuration of the first encoder 73a' and 2D head 79a included in the encoder. As shown in FIGS. 14A and 14B, similar to the first modified example, in the first encoder 73a', a laser beam $LBa_0$ is emitted in the −Z direction from light source LDa. Laser beam $LBa_0$ is reflected by a reflection surface RP and its optical path is bent toward the +Y direction, and then proceeds in the +Y direction inside the solid part of measurement arm 71 via a beam splitter $74a_0$, and enters 2D head 78a.

2D head 79a includes a diffraction grating 76E, which is arranged inclined, at an angle of 45 degrees with respect to the XY plane on the +Y end in measurement arm 71. Diffraction grating 76E is a two-dimensional reflection grating which has a diffraction grating whose periodic direction is in the X-axis direction and a diffraction grating whose periodic direction is in a direction corresponding to the Y-axis direction.

Laser beam $LBa_0$ which has entered 2D head 79a is incident on diffraction grating 76E. This generates a plurality of diffraction lights in directions corresponding to the periodic direction of diffraction grating 76E. FIG. 14B shows ±1st order diffraction lights $LBa_1$ and $LBa_2$ generated in symmetric directions with respect to the Z-axis from the diffraction grating whose periodic direction is in the X-axis direction, and ±1st order diffraction lights $LBa_3$ and $LBa_4$ generated in symmetric directions with respect to the Z-axis from the diffraction grating whose periodic direction is in a direction corresponding to the Y-axis direction. Diffraction lights $LBa_1$ to $LBa_4$ are emitted from the upper surface (the +Z surface) of measurement arm 71 (omitted in FIG. 14B), and then are irradiated on points $DPa_1$ to $DPa_4$ on grating RG as a measurement beams, respectively.

Diffraction lights $LBa_1$ and $LBa_2$, and $LBa_3$ and $LBa_4$ are diffracted by an X diffraction grating and a Y diffraction grating of grating RG, respectively, and follow the original optical paths back returning to diffraction grating 76E via the upper surface of measurement arm 71. Then, diffraction lights $LBa_1$ to $LBa_4$ are incident on the same point on diffraction grating 76E, coaxially synthesized, and then reflected in the −Y direction. Diffraction lights $LBa_1$ to $LBa_4$ (referred to as synthesized light LBa) which have been synthesized, proceed through the solid part inside measurement arm 71 in the −Y direction and is reflected by beam splitter $74a_0$, and then reaches photodetection system 74a, via the upper surface (the +Z surface) of measurement arm 71 (omitted in FIG. 14B).

Now, a diffraction angle (angle of emergence of diffraction lights $LBa_1$ to $LBa_4$) of measurement beam $LBa_0$ at diffraction grating 76E is uniquely decided by a wavelength of measurement beam $LBa_0$ and a pitch of diffraction grating 76E. Similarly, a diffraction angle the bending angle of the optical path) of diffraction lights $LBa_1$ to $LBa_4$ at grating RG is uniquely decided by a wavelength of measurement beam $LBa_0$ and a pitch of the diffraction grating of grating RG. Accordingly, the pitch and setting position of diffraction grating 76E are decided appropriately, in accordance with the wavelength of measurement beam $LBa_0$ and the pitch of the diffraction grating of grating RG, so that diffraction lights $LBa_1$ to $LBa_4$ generated at diffraction grating 76E are diffracted at grating RG and then are coaxially synthesized at diffraction grating 76E.

Synthesized light LBa is received by a two-dimensional light receiving element such as a quartered light receiving element, a CCD or the like in photodetection system 74a. In this case, a two-dimensional Moire pattern (checkered pattern) appears on the photodetection surface of the light receiving element. This two-dimensional pattern changes in accordance with the position of grating RG in the X-axis direction and the Y-axis direction. This change is measured by the light receiving element, and the measurement results are supplied to main controller 20 as the positional information of fine movement stage WFS in the X-axis direction and the Y-axis direction.

Figure 15:
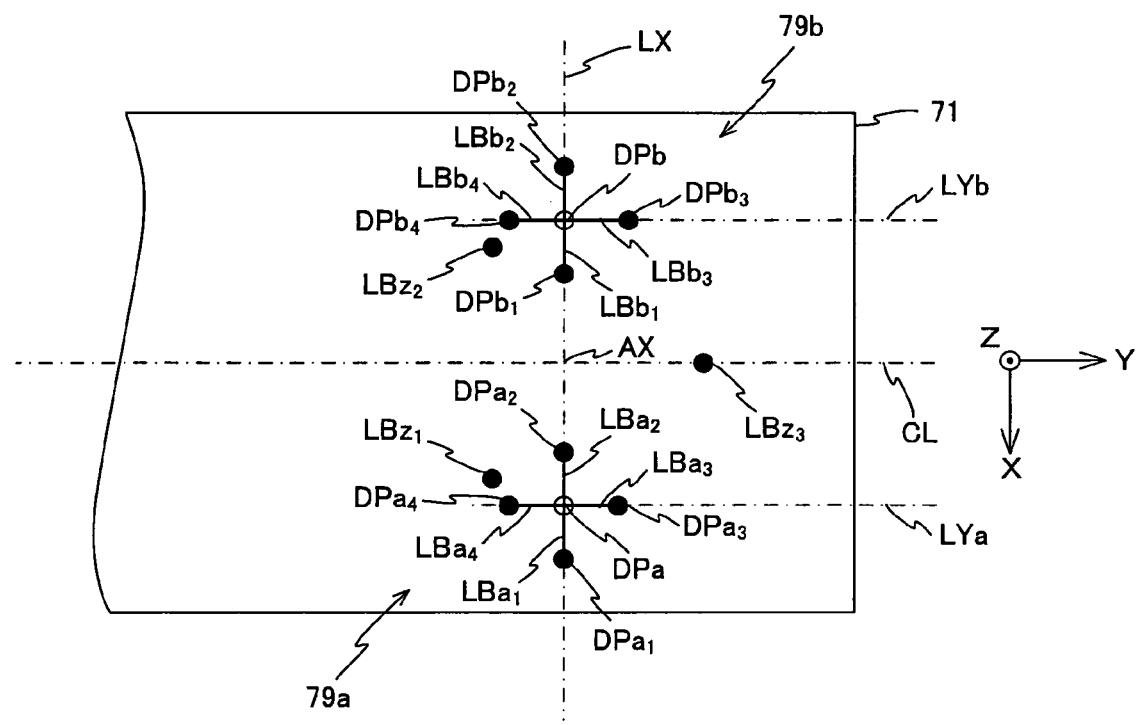
FIG. 15 is a planar view of an upper surface of a tip of the measurement arm related to the second modified example when viewed from the +Z direction.

FIG. 15 shows the upper surface (the +Z surface) of the tip of measurement arm 71 on which 2D head 79a (and 79b) is placed. In this case, as shown in FIG. 15, irradiation points $DPa_1$ and $DPa_2$ of ±1st order diffraction lights $LBa_1$ and $LBa_2$ generated in the X-axis direction on grating RG are positioned on reference axis LX, which passes through the center (optical axis AX) of exposure area IA and is parallel to the X-axis within the XY plane. In the drawing, a center DPa of irradiation points $DPa_1$ and $DPa_2$ is indicated, using a white circle. Further, irradiation points $DPa_3$ and $DPa_4$ of ±1st order diffraction lights $LBa_3$ and $LBa_4$ generated in the Y-axis direction on grating RG are positioned on reference axis LYa, which passes through center DPa and is parallel to the Y-axis within the XY plane. Incidentally, the center of irradiation points $DPa_3$ and $DPa_4$ is equal to center DPa. Accordingly, from the first encoder 73a, positional information of fine movement stage WFS in the X-axis direction and the Y-axis direction, with center DPa of irradiation points $DPa_1$ to $DPa_4$ as the measurement point, can be obtained.

The second encoder 73b is configured in a similar manner as the first encoder 73a. In this case, the second encoder 73b irradiates measurement beams (diffraction lights) $LBb_1$ to $LBb_4$ generated in 2D head 79b, on points $DPb_1$ to $DPb_4$ (refer to FIG. 15) on grating RG. Then, the second encoder 73b synthesizes the measurement beam (diffraction light) $LBb_1$ to $LBb_4$ via 2D head 79b, and receives a synthesized light LBb using photodetection system 74b, via a beam splitter $74b_0$. Accordingly, from the second encoder 73b, positional information of fine movement stage WFS in the X-axis direction and the Y-axis direction, with center DPb of irradiation points $DPb_1$ to $DPb_4$ as the measurement point, is supplied to main controller 20.

As shown in FIG. 15, center DPa of irradiation points $DPa_1$ to $DPa_4$ and center DPb of irradiation points $DPb_1$ to $DPb_4$ on grating RG are placed on reference axis LX which passes through the center (optical axis AX) of exposure area IA and is parallel to the X-axis within the XY plane. In this case, centers DPa and DPb are at positions equidistant from the center (optical axis AX) of exposure area IA on the ±X side, respectively. Therefore, main controller 20 obtains positional information of fine movement stage WFS in the X-axis direction and the Y-axis direction with the center (optical axis AX) of exposure area IA serving as the substantial measurement point, from the average of the measurement results of the first and second encoders 73a and 73b. Furthermore, main controller 20 obtains positional information of fine movement stage WFS in the θz direction with the center (optical axis AX) of exposure area IA serving as the substantial measurement point, from a difference of the measurement results of the first and second encoders 73a and 73b.

Accordingly, by using the encoder system in the second modified example, main controller 20 can constantly perform positional information measurement of fine movement stage WFS within the XY plane at the center of exposure area IA when exposing wafer W mounted on fine movement stage WFS, as in the case previously described when encoder system 73 is used.

Figure 16:
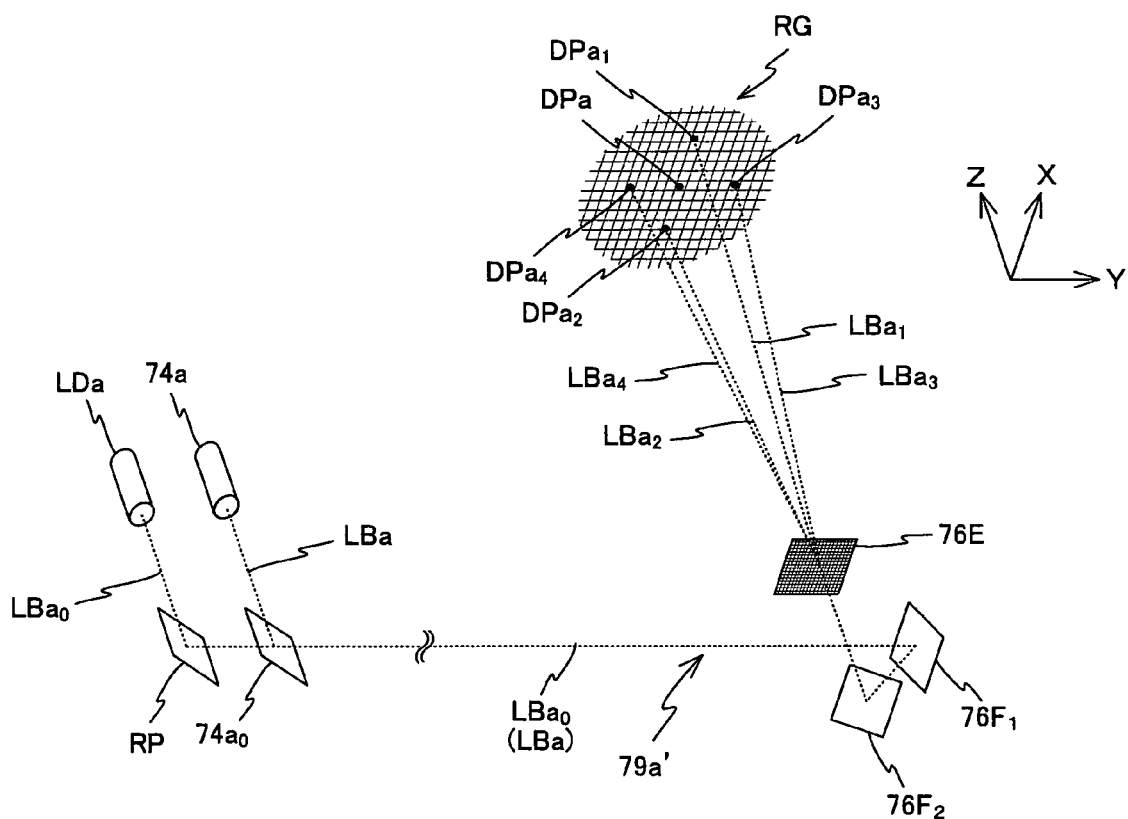
FIG. 16 is a view showing a rough configuration of a head 79a' which configures an encoder system related to a third modified example.

Incidentally, in the second modified example described above, while 2D head 79a was employed which includes diffraction grating 76E arranged inclined at an angle of 45 degrees with respect to the XY plane, as well as this, a 2D head 79a' having a configuration is shown in FIG. 16 can be employed. In 2D head 79a', on the optical path of measurement beam $LBa_0$, a pair of reflection surfaces $76F_1$ and $76F_2$ (so-called pentamirrors (or pentaprisms)) is provided that are orthogonal to the YZ plane and face each other at an angle of 45 degrees. Incidentally, diffraction grating 76E is arranged parallel to the XY plane. Measurement beam $LBa_0$, which enters 2D head 79a' in parallel with the Y-axis, is sequentially reflected by reflection surfaces $76F_1$ and $76F_2$ and then proceeds toward diffraction grating 76E in parallel with the Z-axis. On the contrary, synthesized light LBa returning from diffraction grating 76E in parallel with the Z-axis is sequentially reflected by reflection surfaces $76F_2$ and $76F_1$, and then is emitted from 2D head 79a' in parallel with the Y-axis. More specifically, the measurement beam (and the synthesized light) is emitted in a direction orthogonal to the incident direction without fail, via pentamirrors $76F_1$ and $76F_2$. Therefore, for example, even if measurement arm 71 is deflected due to the weight of the arm itself or vibrates by the movement of wafer stage WST, because irradiation points $DPb_1$ to $DPb_4$ of diffraction lights $LBa_1$ to $LBa_4$ on grating RG do not move, this benefits in no measurement errors. Further, a similar effect can be obtained by providing pentamirrors $76F_1$ and $76F_2$ instead of reflection surface 76A within 2D head (refer to FIG. 12B) employed in the first modified example.

Incidentally, fine movement stage position measurement system 70 can measure positional information in directions of six degrees of freedom of the fine movement stage only by using encoder system 73, without being equipped with laser interferometer system 75. Besides this, an encoder which can measure positional information in at least one of the X-axis direction and the Y-axis direction, and the Z-axis direction can also be used. For example, by irradiating measurement beams from a total of three encoders including an encoder which can measure positional information in the X-axis direction and the Z-axis direction and an encoder which can measure positional information in the Y-axis direction and the Z-axis direction, on three measurement points that are noncollinear, and receiving the return lights, positional information of the movable body on which grating RG is provided can be measured in directions of six degrees of freedom. Further, the configuration of encoder system 73 is not limited to the embodiment described above, and is arbitrary.

Incidentally, in the embodiment above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced.

Incidentally, in the embodiment above, while the example was given where the wafer stage was a coarse/fine movement stage which is a combination of a coarse movement stage and a fine movement stage, the present invention is not limited to this.

Figure 17:
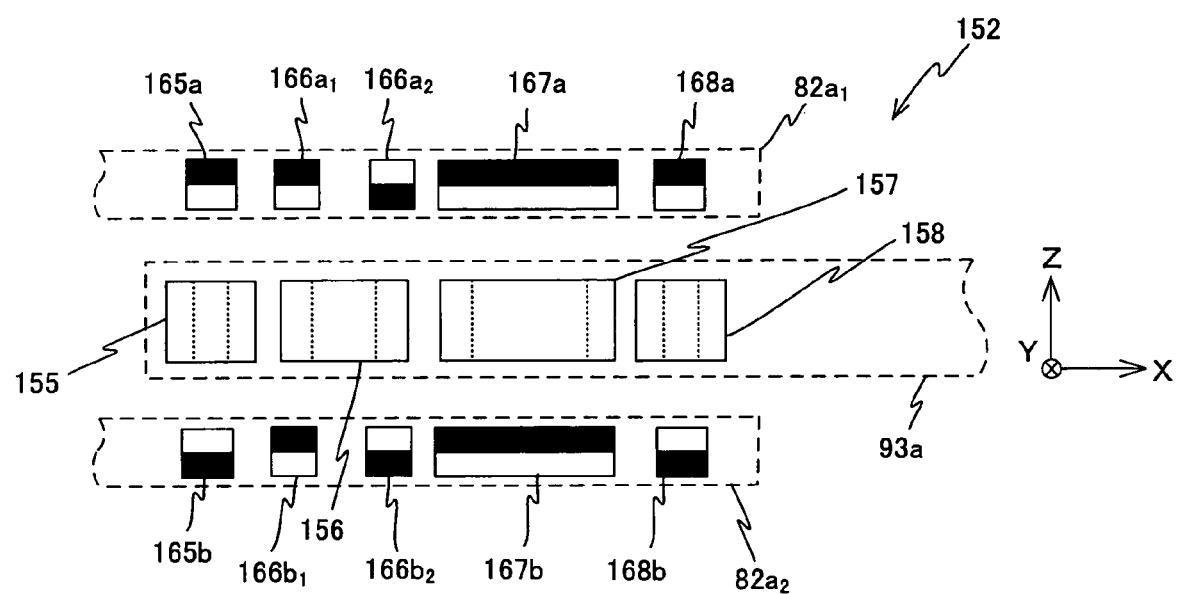
FIG. 17 is a view showing a modified example of a fine movement stage drive system.

Further, the configuration of fine movement stage drive system 52 driving fine movement stage WFS with respect to coarse movement stage WCS is not limited to the one described in the embodiment above. FIG. 17 shows another example of the fine movement stage drive system. In fine movement stage drive system 52 in the embodiment described above, while fine movement stage WFS was driven in Y-axis direction and the Z-axis direction using YZ coils 55 and 57 that were in common, in a fine movement stage drive system 152 shown in FIG. 17, Z drive coils 155 and 158 used exclusively to drive fine movement stage WFS in the Z-axis direction, and a Y drive coil 157 used exclusively to drive fine movement stage WFS in the Y-axis direction are provided. In fine movement stage drive system 152, a plurality of first Z drive coils 155 is placed along the Y-axis direction in the vicinity of an end on the −X side inside stator section 93a, and on the +X side of these coils, X drive coil 156 whose longitudinal direction is in the Y-axis direction and drives fine movement stage WFS in the X-axis direction is placed. Further, on the +X side of X drive coil 156, a plurality of Y drive coils 157 is placed along the Y-axis direction, and furthermore, on the +X side of these coils, a plurality of second Z drive coils 158 is placed along the Y-axis direction. In platelike members $82a_1$ and $82a_2$ of fine movement stage WFS, permanent magnet 165a to 168a, and 165b to 168b are placed facing these coils 155 to 158 (for the placement of each of the permanent magnets, refer to FIGS. 4, 5A, and 5B). In fine movement stage drive system 152 shown in FIG. 17, control is easy because Z drive coils 155 and 158, and Y drive coil 157 can be controlled independently. Further, because fine movement stage WFS can be supported by levitation with a constant levitation force regardless of fine movement stage WFS in the Y-axis direction, the position of wafer W in the Z-axis direction becomes stable.

Incidentally, in the embodiment above, while fine movement stage WFS is supported in a noncontact manner by coarse movement stage WCS by the action of the Lorentz force (electromagnetic force), besides this, for example, a vacuum preload type hydrostatic air bearing and the like can be arranged on fine movement stage WFS so that it is supported by levitation with respect to support coarse movement stage WCS. Further, in the embodiment above, while fine movement stage WFS could be driven in directions of all 6 degrees of freedom, the present invention is not limited to this, and fine movement stage WFS only needs to be able to move within a two-dimensional plane which is parallel to the XY plane. Further, fine movement stage drive system 52 is not limited to the magnet moving type described above, and can also be a moving coil type as well. Furthermore, fine movement stage WFS can also be supported in contact with coarse movement stage WCS. Accordingly, as fine movement stage drive system 52 which drives fine movement stage WFS with respect to coarse movement stage WCS, for example, a rotary motor and a ball screw (or a feed screw) can also be combined for use.

Incidentally, the fine movement stage position measurement system can be configured so that position measurement is possible within the total movement range of wafer stage WST. In this case, wafer stage position measurement system 16 will not be required. Further, in the embodiment above, base board 12 can be a counter mass which can move by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Further, in the embodiment above, the case has been described where the exposure apparatus is a liquid immersion type exposure apparatus. However, the present invention is not limited to this, but can also be applied suitably in a dry type exposure apparatus that performs exposure of wafer W without liquid (watery.

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

In addition, the illumination light IL of the exposure apparatus 10 in the abovementioned embodiment is not limited to light with a wavelength of 100 nm or greater, and, of course, light with a wavelength of less than 100 nm may be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or en ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder system and a laser interferometer system.

Further, as is disclosed in, for example, PCT International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all publications, the PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body apparatus, comprising:
a movable body which is movable with an object mounted on a surface thereof, within a predetermined plane including a first axis and a second axis that are orthogonal to each other, and which has a measurement plane substantially parallel to the predetermined plane, the measurement plane being located lower than the surface;
a first measurement system which has an arm member having at least one end section facing the measurement plane from below and whose longitudinal direction is in a direction substantially parallel to the first axis, the first measurement system irradiating at least one first measurement beam on the measurement plane from the arm member, receiving light from the measurement plane of the first measurement beam, and measuring a position of the movable body at least within the predetermined plane; and
a drive system which drives the movable body based on an output of the first measurement system.

2. The movable body apparatus according to claim 1 wherein
the first measurement beam proceeds in a direction parallel to the first axis inside the arm member, and
the arm member has an optical system which irradiates the first measurement beam proceeding inside the arm member toward the measurement plane, in the vicinity of the one end.

3. The movable body apparatus according to claim 2 wherein
the optical system includes a pair of reflection surfaces that face each other at an angle of 45 degrees, whereby
the first measurement beam is sequentially reflected by the pair of reflection surfaces, and proceeds to the measurement plane.

4. The movable body apparatus according to claim 1 wherein
a grating is formed on the measurement plane, and
the first measurement system receives a diffraction light from the grating of the first measurement beam.

5. The movable body apparatus according to claim 4, the apparatus further comprising:
an optical system that makes one of the diffraction light from the grating and a synthesized light of a plurality of diffraction lights from the grating proceed in a direction parallel to the first axis inside the arm member.

6. The movable body apparatus according to claim 4 wherein
the grating includes a first diffraction grating and a second diffraction grating whose periodic directions are in a direction parallel to the first axis and a direction parallel to the second axis, respectively, whereby
the first measurement system irradiates a first axis direction measurement beam and a second axis direction measurement beam corresponding to the first and the second diffraction gratings from the arm member to the grating, respectively, as the first measurement beam, and receives a diffraction light from each of the gratings of the first axis direction measurement beam and the second axis direction measurement beam, and measures a position of the movable body in a direction parallel to the first axis and a direction parallel to the second axis.

7. The movable body apparatus according to claim 6 wherein
the first measurement system irradiates at least two measurement beams whose irradiation points on the first diffraction grating are different to each other in a direction parallel to the second axis, on the first diffraction grating as the first axis direction measurement beam.

8. The movable body apparatus according to claim 7 wherein
the at least two measurement beams and the second axis direction measurement beam are each irradiated on an irradiation point on a straight line parallel with the second axis on the grating.

9. The movable body apparatus according to claim 6 wherein
the first measurement system further has at least one third diffraction grating whose periodic direction is in a direction corresponding to a direction parallel to the first axis on an optical path of the first axis direction measurement beam.

10. The movable body apparatus according to claim 6 wherein
the first measurement system further has at least one fourth diffraction grating whose periodic direction is in a direction corresponding to a direction parallel to the second axis on an optical path of the second axis direction measurement beam.

11. The movable body apparatus according to claim 6 wherein
the first measurement system further has at least one fifth diffraction grating whose periodic direction is in two directions corresponding to a direction parallel to the first axis and a direction parallel to the second axis on optical paths of the first axis direction measurement beam and the second axis direction measurement beam.

12. The movable body apparatus according to claim 1 wherein
an outgoing end section of the first measurement beam with respect to the measurement plane of the arm member faces the measurement plane in a movement range of the movable body.

13. The movable body apparatus according to claim 1 wherein
the arm member has a cross section orthogonal to the first axis which is a rectangular shape.

14. The movable body apparatus according to claim 1, the apparatus further comprising:
a second measurement system which includes a light wave interference measurement instrument that irradiates a plurality of second measurement beams on the movable body and receives a reflected light to measure a tilt of the movable body with respect to the predetermined plane, whereby
the drive system drives the movable body based on an output of the first and the second measurement systems.

15. The movable body apparatus according to claim 14 wherein
the light wave interference measurement instrument also measures a position of the movable body in a direction orthogonal to the predetermined plane.

16. The movable body apparatus according to claim 1 wherein
the first measurement system measures a positional information of the movable body in directions parallel to the first and the second axes, a direction orthogonal to the predetermined plane, and a rotational direction around an axis parallel to each of the first axis and the second axis, by irradiating the first measurement beam on at least three points of the measurement plane and receiving light from each of the irradiation points of the first measurement beam on the measurement plane.

17. An exposure apparatus that forms a pattern on an object by an irradiation of an energy beam, the apparatus comprising:
the movable body apparatus according to claim 1; and
a patterning device which irradiates the energy beam on the object mounted on the movable body.

18. The exposure apparatus according to claim 17 wherein
a measurement center which is a center of an irradiation point of the first measurement beam irradiated on the measurement plane from the first measurement system coincides with an exposure position which is a center of an irradiation area of the energy beam irradiated on the object.

19. The exposure apparatus according to claim 17 wherein
the patterning device is supported by a support member, and includes a projection optical system that projects the energy beam on the object, and
the arm member is supported by the support member.

20. The exposure apparatus according to claim 17 wherein
the movable body is made of a solid member within which the first measurement beam proceeds, and
of planes substantially parallel to the predetermined plane of the movable body, the measurement plane is formed on a first plane facing the object and
the arm member faces a second plane different from the first plane.

21. The exposure apparatus according to claim 17 wherein
the movable body includes a first movable member which has a space in which the arm member is inserted inside and is movable at least along the predetermined plane, and a second movable member which is relatively movable with respect to the first movable member at least within a plane parallel to a predetermined plane holding the object and which has the measurement plane provided on its surface substantially parallel to the predetermined plane, whereby
the drive system drives the second movable member individually or integrally with the first movable member, based on the positional information measured by the first measurement system.

22. The exposure apparatus according to claim 21 wherein
one end and the other end on an opposite side of the one end with the measurement plane in between of the second movable member are each supported by the first movable member, whereby
the drive system includes a first drives section which applies a drive force on the one end of the second movable member, and a second drive section which applies a drive force on the other end.

23. The exposure apparatus according to claim 22 wherein
the first and the second drive sections generates a drive force in directions parallel to the first axis and the second axis, a direction orthogonal to the predetermined plane, and a rotational direction around an axis parallel to each of the first axis and the second axis, and a magnitude of the drive force and a direction of generation of the drive force each are controlled independently.

24. The exposure apparatus according to claim 22 wherein
the first and the second drive sections each include a coil unit placed at the first movable member and a magnet unit placed at the second movable member, and drive the second movable member in a noncontact manner.

25. The exposure apparatus according to claim 21 wherein
on scanning exposure where the object is scanned in a scanning direction within the predetermined plane with respect to the energy beam,
the drive system scans and drives only the second movable member in the scanning direction, based on the positional information measured by the first measurement system.

26. A device manufacturing method, the method including:
exposing an object using the exposure apparatus according to claim 17; and
developing the object which has been exposed.

27. The movable body apparatus according to claim 1, wherein
light passes through inside the arm member.

28. The movable body apparatus according to claim 27, wherein
at least a part of the arm member is made of a solid section that is light transmissive.

29. The movable body apparatus according to claim 27, wherein
at least a part of the arm member is made of a hollow section.

30. A movable body drive method in which a movable body on a surface of which an object is mounted is driven along a predetermined plane, the method comprising:
a drive process in which at least one first measurement beam is irradiated to a measurement plane substantially parallel to the predetermined plane on the movable body, from an arm member which has at least one end section facing the measurement plane from below and whose longitudinal direction is in a first axis direction substantially parallel to the predetermined plane, light from the measurement plane of the first measurement beam is received, a position of the movable body at least within the predetermined plane is measured, and the movable body is driven based on results of the measurement, the measurement plane being located lower than the surface.

31. The movable body drive method according to claim 30 wherein
a grating is formed on the measurement plane, and
in the process, a diffraction light from the grating of the first measurement beam is received.

32. An exposure method in which a pattern is formed on an object by an irradiation of an energy beam, the method comprising:
a drive process in which a movable body on which the object is mounted is driven using the movable body drive method according to claim 30 to perform pattern formation to the object.

33. A device manufacturing method, the method including:
exposing an object using the exposure method according to claim 32; and
developing the object which has been exposed.

34. The movable body drive method according to claim 30, wherein
light passes through inside the arm member.

35. The movable body drive method according to claim 34, wherein
at least a part of the arm member is made of a solid section that is light transmissive.

36. The movable body drive method according to claim 34, wherein
at least a part of the arm member is made of a hollow section.

* * * * *